United States Patent
Osburn

(10) Patent No.: US 7,319,269 B2
(45) Date of Patent: Jan. 15, 2008

(54) SEMICONDUCTOR DEVICE POWER INTERCONNECT STRIPING

(75) Inventor: Edward P. Osburn, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/089,914

(22) Filed: Mar. 24, 2005

(65) Prior Publication Data

US 2005/0248040 A1    Nov. 10, 2005

Related U.S. Application Data

(60) Division of application No. 10/335,368, filed on Dec. 30, 2002, now Pat. No. 7,005,736, which is a continuation-in-part of application No. 10/261,544, filed on Sep. 30, 2002, now abandoned.

(51) Int. Cl.
*H01L 23/48* (2006.01)

(52) U.S. Cl. ............... 257/697; 257/778; 257/774; 257/698; 257/E23.069

(58) Field of Classification Search ............ 257/778, 257/779, 737, 738, 780, 697, 698, 691, 786, 257/203, 207–208, 211, E21.597, E23.021, 257/E23.069, E21.508, 774, 621
See application file for complete search history.

(56) References Cited

U.S. PATENT DOCUMENTS

| | | |
|---|---|---|
| 5,479,319 A | 12/1995 | Werther |
| 5,481,435 A | 1/1996 | Werther |
| 5,796,170 A | 8/1998 | Marcantonio |
| 5,985,695 A | 11/1999 | Freyman et al. |
| 5,994,766 A | 11/1999 | Shenoy et al. |
| 6,037,677 A | 3/2000 | Gottschall et al. |
| 6,232,564 B1 | 5/2001 | Arndt et al. |
| 6,278,264 B1 * | 8/2001 | Burstein et al. ............ 323/282 |
| 6,404,649 B1 | 6/2002 | Drake et al. |
| 6,462,522 B2 | 10/2002 | Burstein et al. |
| 6,630,737 B2 * | 10/2003 | Zhao et al. .................. 257/738 |

(Continued)

FOREIGN PATENT DOCUMENTS

EP    1 098 555 A2    5/2001

(Continued)

OTHER PUBLICATIONS

Anonymous: "AMD Athlon TM Processor Model 4 Data Sheet" Internet Article, Online! Nov. 2001, XP002296966 Retrieved from the Internet: <URL:http://www.amd.com/us-en/assets/content_type/white_papers_and_tech_docs/23792.pdf>  p. 39-51.

*Primary Examiner*—Hoai V Pham
*Assistant Examiner*—DiLinh Nguyen
(74) *Attorney, Agent, or Firm*—Blakely, Sokoloff, Taylor & Zafman LLP

(57) ABSTRACT

A method and an apparatus for improving the delivery and filtering of power to a semiconductor device is disclosed by organizing out interconnects (pins, balls, pads or other interconnects) used to carry power in a striped configuration that shortens the conductive path required between a power source and a semiconductor device and that reduces the resistance of that conductive path.

8 Claims, 20 Drawing Sheets

U.S. PATENT DOCUMENTS

| | | |
|---|---|---|
| 2001/0035746 A1 | 11/2001 | Burstein et al. |
| 2002/0047179 A1 | 4/2002 | Shimizu et al. |
| 2002/0060318 A1* | 5/2002 | Katz .......................... 257/24 |
| 2003/0042619 A1 | 3/2003 | Huang |
| 2003/0047356 A1 | 3/2003 | Searls et al. |

FOREIGN PATENT DOCUMENTS

| | | |
|---|---|---|
| EP | 1 098 555 | 11/2001 |

* cited by examiner

US 7,319,269 B2

SEMICONDUCTOR DEVICE POWER INTERCONNECT STRIPING

This application is a divisional of application Ser. No. 10/335,368, entitled "Semiconductor Device Power Interconnect Striping," filed Dec. 30, 2002 now U.S. Pat. No. 7,005,736, assigned to the corporate assignee of the present invention and incorporated by reference, which is a continuation-in-part of 10/261,544, entitled "Semiconductor Device Power Interconnect Striping," filed Sep. 30, 2002, now abandoned assigned to the corporate assignee of the present invention and incorporated herein by reference.

FIELD OF THE INVENTION

A method and an apparatus for improving the delivery and filtering of power to a semiconductor device is disclosed.

ART BACKGROUND

As semiconductor devices, especially processors, have continued to increase in complexity and capability, they have also continued to require ever increasing amounts of power. Indeed, the amount of electrical current required in supplying power to such semiconductor devices has made it a commonplace practice to devote many of the pins, balls, pads or other types of interconnect (though it is common practice to use the term "pins" as engineering shorthand for the term "interconnect" regardless of whether the interconnects are truly pins or not) to ensure sufficient current capacity and adequate voltage.

FIG. 1 depicts a prior art pinout 100 for a semiconductor device. Specifically, FIG. 1 depicts the pinout used by Advanced Micro Devices of Sunnyvale, California for a series of processors. As shown, Vss interconnects 150 and Vcc interconnects 160 are dispersed throughout pinout 100. FIG. 2 depicts a prior art pinout 200 for another semiconductor device. Specifically, FIG. 2 depicts the pinout used by Intel Corporation of Santa Clara, Calif. for a different series of processors. Somewhat like the case in pinout 100, Vss interconnects 250 and Vcc interconnects 260 are dispersed through pinout 200.

As can be seen in both FIGS. 1 and 2, a large proportion of the available interconnects have been devoted to supplying power. However, the dispersion of both Vss and Vcc interconnects throughout pinouts 100 and 200 does not permit the use of large uninterrupted traces to carry power across a printed circuit board (PCB) from a power source to the Vss or Vcc interconnects of either pinouts 100 or 200. Furthermore, this same dispersion of both Vss and Vcc interconnects also results in any ground or power plane used to supply Vss and/or Vcc being so riddled with holes as to become too discontiguous to carry a large current with only low resistance. As those skilled in the art of PCB design will recognize, the sheer number of interconnects in semiconductor device pinouts, such as pinouts 100 and 200, requires that the interconnects be spaced closely together, which in turn requires that multiple layers of PCB traces be used to carry power and/or signals to and from these interconnects. This is the case regardless of whether a semiconductor device is attached to a PCB using current surfacemount or older through-hole approaches, because although the interconnects in surfacemount approaches don't penetrate through layers of a PCB, themselves, they require connections through vias that do.

With the use of either smaller traces or planes riddled with holes to supply power to semiconductor devices comes a corresponding increase in resistance, and this reduces the effectiveness of filtering capacitors placed adjacent to or in the middle of either pinouts 100 or 200. Transients caused by a semiconductor device and transmitted by one or more Vss and/or Vcc interconnects to a PCB are caused to last longer, have larger magnitudes, and not be as swiftly countered by filtering capacitors since these transients take longer than is often desirable to reach the filtering capacitors when propagating through traces and/or planes of such higher resistance. Furthermore, where a voltage regulator is used to supply power to a semiconductor device, these same traces and/or planes of such higher resistance result in changes in current requirements taking longer to be reflected at the output of even a voltage regulator located immediately adjacent to the semiconductor device, because the higher resistance does not allow the resulting change in voltage at the Vss and/or Vcc interconnects to propagate as quickly towards the output of the voltage regulator so that the voltage regulator may boost or lower its output as appropriate. Finally, the higher resistance results in more of the power meant for the semiconductor device to be lost as heat dissipated by the traces and/or planes.

BRIEF DESCRIPTION OF THE DRAWINGS

The objects, features, and advantages of the invention as hereinafter claimed will be apparent to one skilled in the art in view of the following detailed description in which:

DETAILED DESCRIPTION

Although numerous details are set forth for purposes of explanation and to provide a thorough understanding in the following description, it will be apparent to those skilled in the art that these specific details are not required in order to practice embodiments of the invention as hereinafter claimed.

A method and apparatus for improving the conducting of power from a power source to a semiconductor device is disclosed. Specifically, a layout of interconnects (pins, balls, pads or other interconnects) is disclosed in which interconnects used to carry power are organized in a striped configuration that shortens the conductive path required between a power source and a semiconductor device and that reduces the resistance of that conductive path. Although the discussion is largely centered on semiconductor devices with packages in which pins are organized into a largely grid-like array, it will be understood by those skilled in the art that the invention as hereinafter claimed is applicable to a wide variety of electronic devices using a wide variety of configurations of packages. Also, although the term "pinout" is used to refer to the physical layout of interconnects of the package of a semiconductor device, this is only done in recognition of the common use of this term in industry, and is in no way meant to be construed as limiting the application of the teachings herein to semiconductor devices with packages on which actual pins are the particular type of interconnect used.

Figure 1:
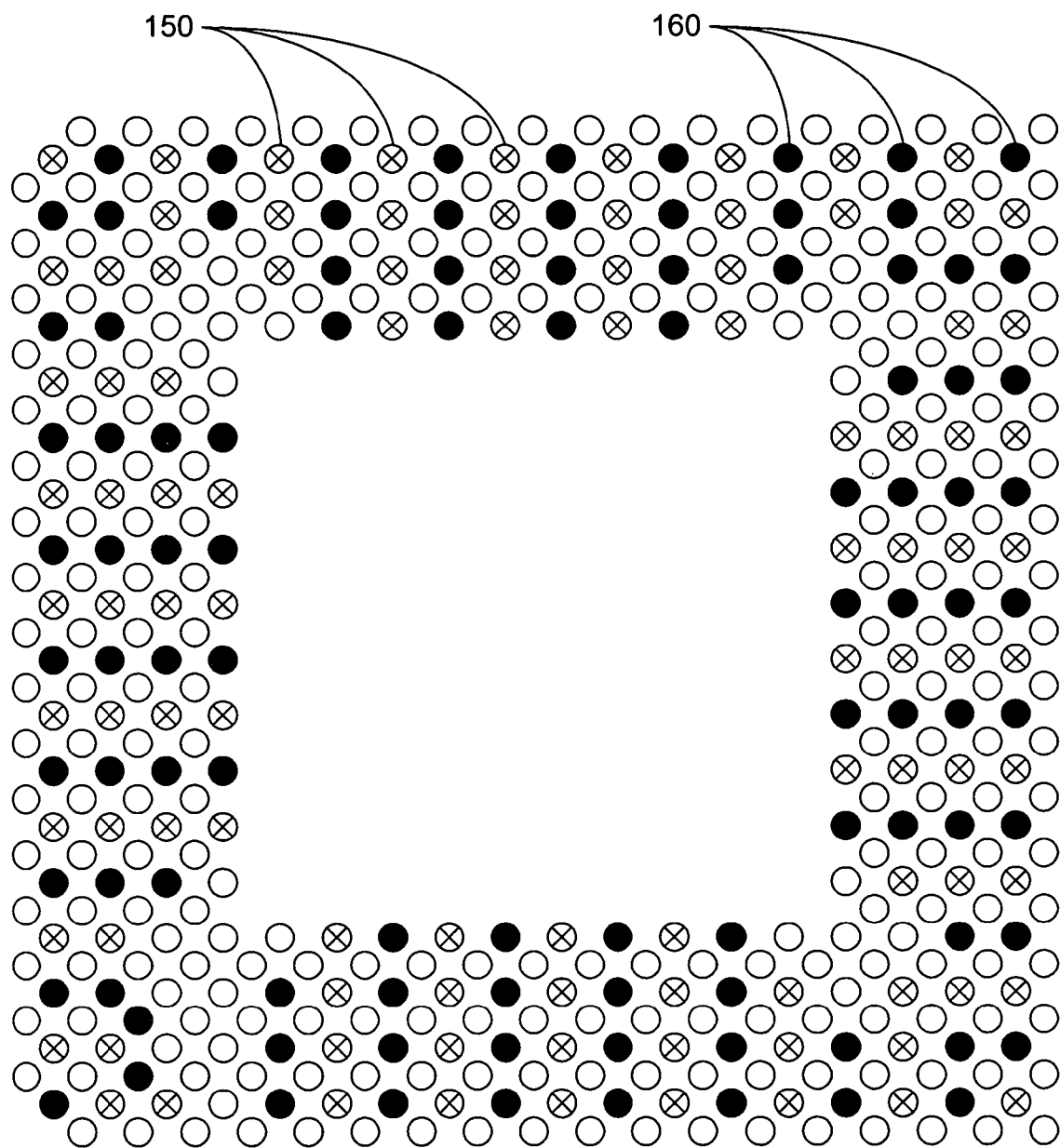
FIG. 1 depicts a prior art pinout.
Figure 2:
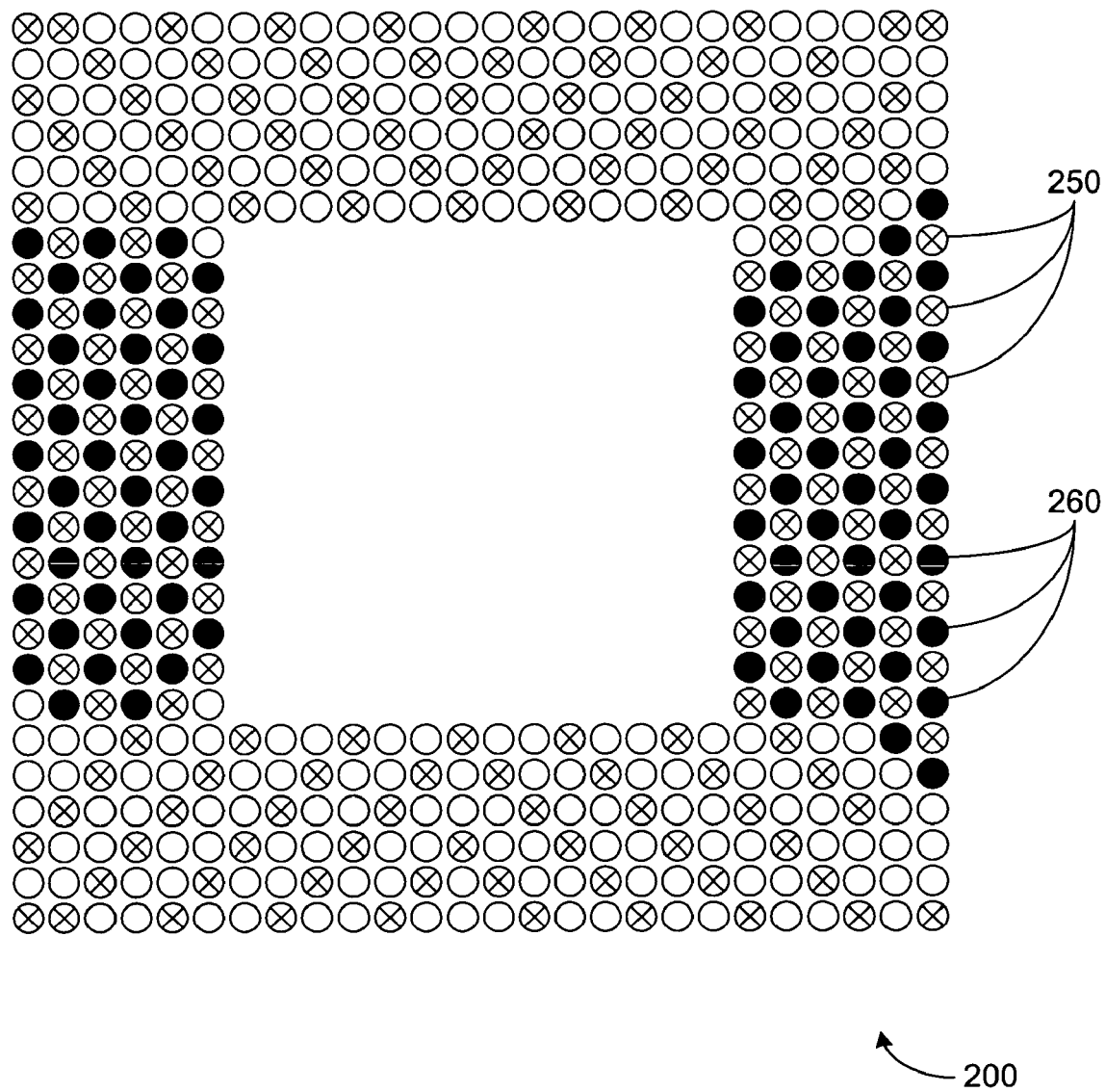
FIG. 2 depicts another prior art pinout.
Figure 3:
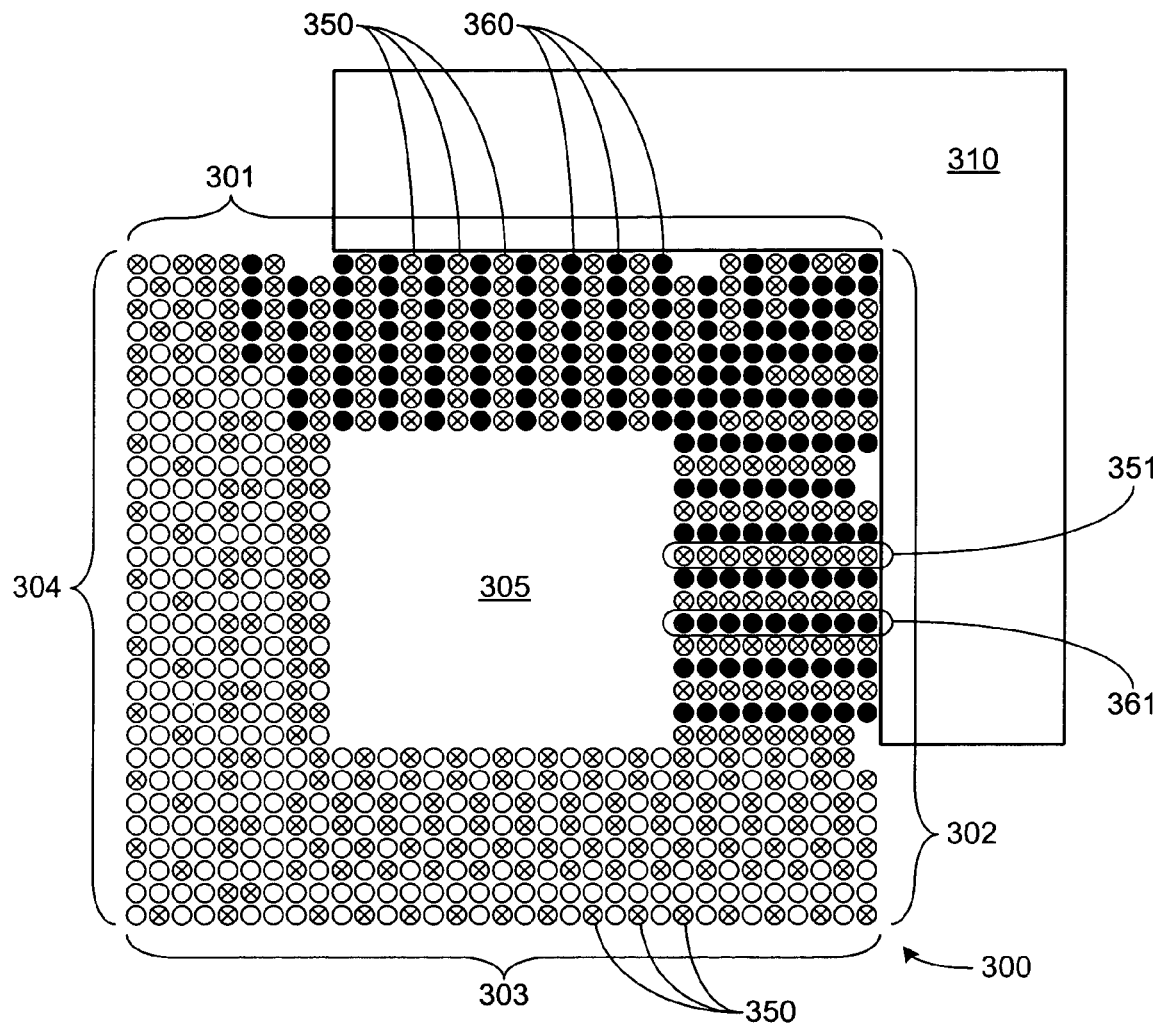
FIG. 3 depicts an embodiment of a pinout.

FIG. 3 depicts an embodiment of a pinout with a semiconductor device. The interconnects of pinout 300 are arranged in a two-dimensional grid pattern having four distinct sides, including sides 301 and 302, and unpopulated center 305. Along sides 301 and 302, Vss interconnects 350 and Vcc interconnects 360 are arranged in contiguous stripes of interconnects, such as Vss stripe 351 and Vcc stripe 361, most of which run in alternating parallel lines.

Pinout 300 may also have more of Vss interconnects 350 dispersed among the signal interconnects within sides 303 and 304. However, the use of differential signaling among the signal interconnects within sides 303 and 304 and/or other factors may allow the number of Vss interconnects 350 within sides 303 and/or 304 to be reduced in quantity from what is depicted in FIG. 3, or perhaps, eliminated altogether.

The stripes of Vss and Vcc interconnects, 350 and 360, such as Vss stripe 351 and Vcc stripe 361, permit traces and/or planes to provide larger pathways to carry current from a power source to the semiconductor device using pinout 300. In one embodiment, the stripes formed by Vss and Vcc interconnects, 350 and 360, as shown, are oriented in directions that would be advantageous for having a source of Vss and Vcc located along sides 301 and 302, such as at location 310. In alternate embodiments, the stripes formed by Vss and Vcc interconnects, 350 and 360, along sides 301 and 302 may be oriented in other directions, perhaps to accommodate the placement of a source of Vss and Vcc only at the corner formed by sides 301 and 302, or perhaps along only one of sides 301 or 302.

Figure 4:
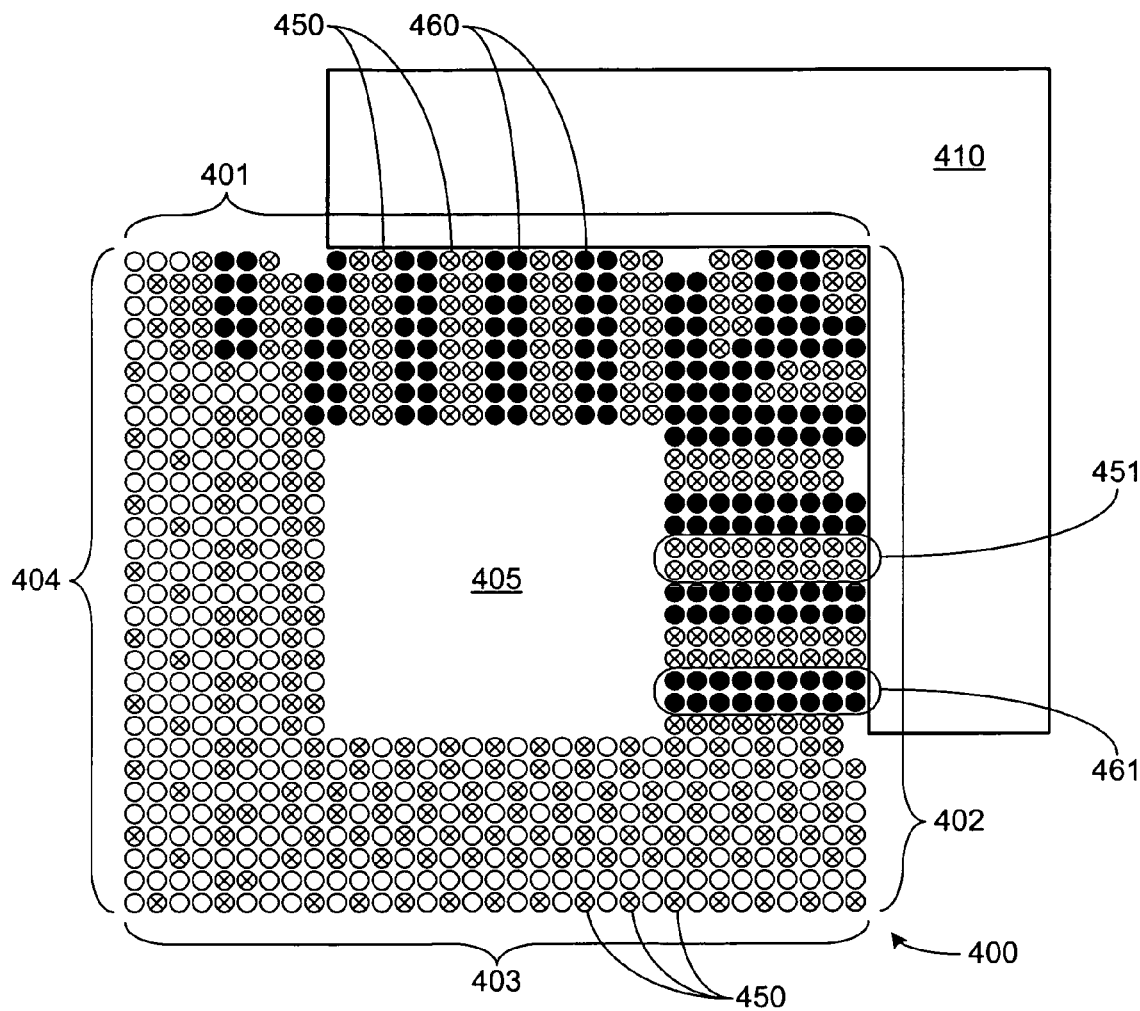
FIG. 4 depicts another embodiment of a pinout.

FIG. 4 depicts another embodiment with a pinout of a semiconductor device. As in pinout 300 of FIG. 3, the interconnects of pinout 400 are arranged in a two-dimensional grid pattern having four distinct sides, including sides 401 and 402, and unpopulated center 405. Along sides 401 and 402, Vss interconnects 450 and Vcc interconnects 460 are arranged in contiguous stripes of interconnects, such as Vss stripe 451 and Vcc stripe 461, most of which run in alternating parallel lines. Pinout 400 may also have more of Vss interconnects 450 dispersed among the signal interconnects within sides 403 and 404.

As was the case in pinout 300 of FIG. 3, the stripes of Vss interconnects 450 and Vcc interconnects 460 of pinout 400, such as Vss stripe 451 and Vcc stripe 461, make possible traces and/or planes that can provide larger pathways to carry more current from a power source to the semiconductor device. However, unlike the stripes of Vss interconnects 350 and Vcc interconnects 360 of pinout 300, most of the stripes of Vss interconnects 450 and Vcc interconnects 460 of pinout 400 are made up of double rows or columns of interconnects. These double-wide stripes of interconnects permit even larger traces to be used to carry current. Also, these double-wide stripes provide opportunities for planes being penetrated by fewer vias for Vss and/or Vcc, or for such vias to be arrayed in a manner that reduces the impact on the ability of planes to carry more current.

Although FIG. 3 depicts stripes made up of only single columns and/or rows of interconnects, and FIG. 4 depicts double-wide stripes, it will be understood by those skilled in the art that the teachings herein may be practiced with regard to yet wider stripes (e.g., triple-wide stripes, etc.). The choice of width of stripes, in some embodiments, may be based on aspects of the design of the circuitry and/or die of a semiconductor device having Vss interconnects and/or Vcc interconnects arrayed in stripes, or by aspects of the design of the package used for such a semiconductor device. Alternatively, in other embodiments, the choice of width of stripes may be based on aspects such as how inductive the particular type of interconnect used may be and/or the effect of the choice of interconnect on loop inductance between Vcc and Vss pins. Such aspects as are taken into account would have to be balanced with the differences in resistance that would arise for each possible stripe width.

Figure 5:
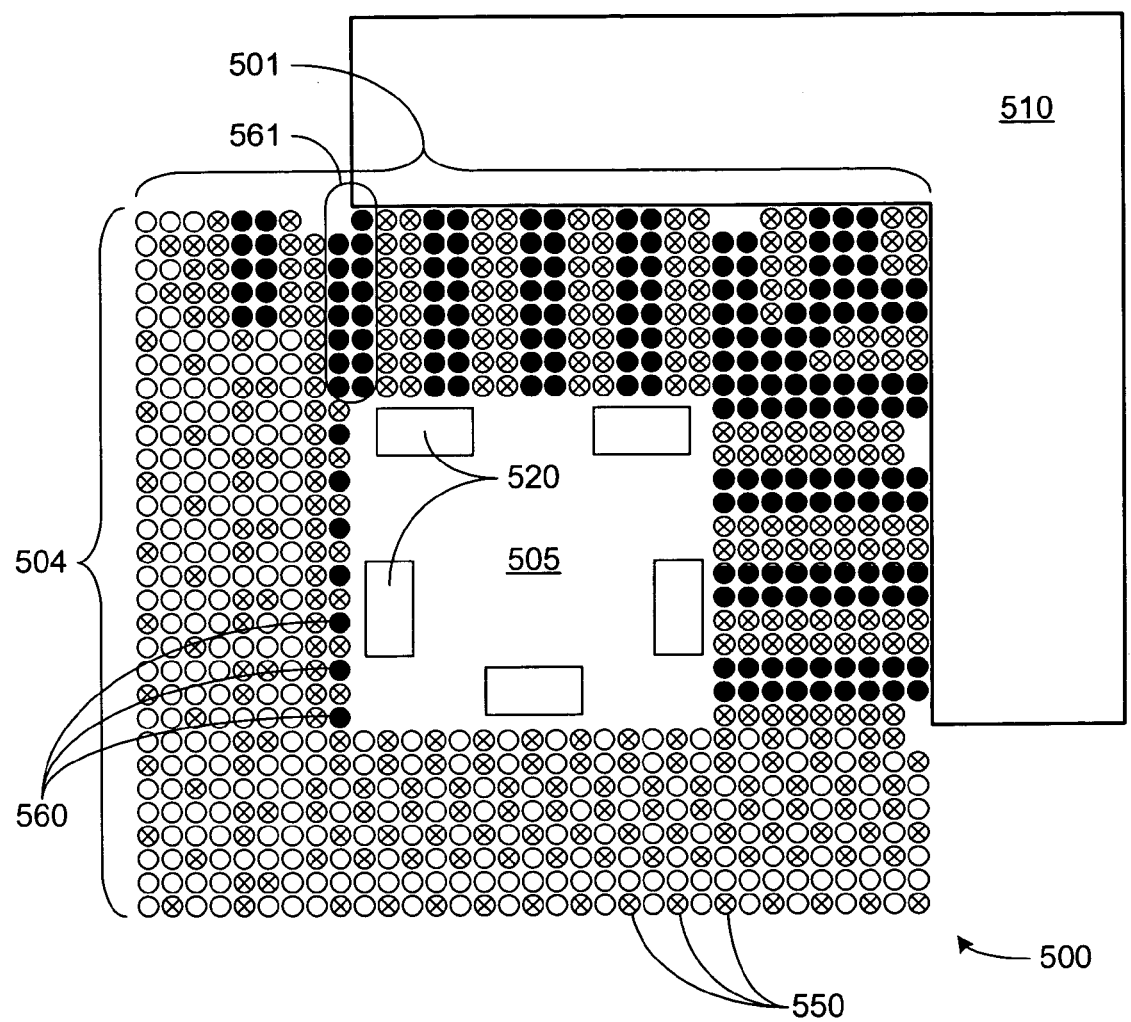
FIG. 5 depicts still another embodiment of a pinout.

FIG. 5 depicts still another embodiment with a pinout of a semiconductor device. Pinout 500 is largely similar to pinout 400 of FIG. 4, including having stripes of Vss and Vcc interconnects oriented in directions advantageous for having a source of Vss and Vcc at location 510. The principal difference between pinout 400 and pinout 500 is that a number of additional Vss interconnects 560 have been placed within side 504 of pinout 500 along one edge of center location 505.

Within center location 505 are positioned a plurality of filtering components 520. Filtering components 520 could be capacitors and/or other varieties of components used to counter spikes, troughs and/or other forms of transients in Vss and/or Vcc conductors adjacent to the interconnects of pinout 500. These additional Vss interconnects 560 are provided along one edge of center location 505 within side 504 to enhance the effectiveness of filtering components 520 by providing a shorter conductive path between Vss within a semiconductor device using pinout 500 and at least one of filtering components 520. The location of these additional Vss interconnects 560 along side 504 permits the stripe formed by these additional Vss interconnects 560 to essentially extend Vss stripe 561 formed in side 501, thereby allowing at least a larger trace of conductive material on a PCB where pinout 500 is used to continue along the extended stripe to reduce the likelihood of differential voltages developing between Vss interconnects 560 along the extended stripe.

Figure 6:
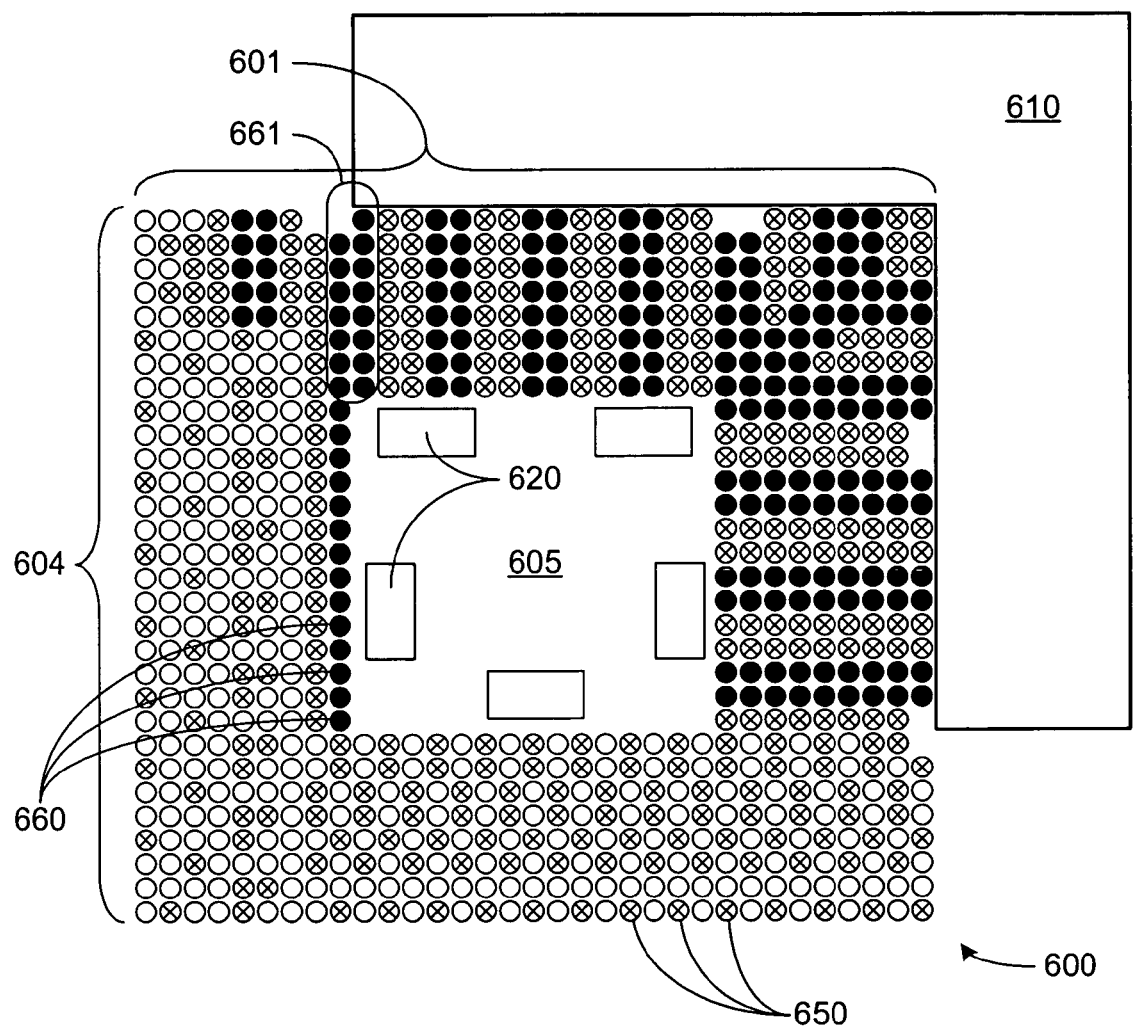
FIG. 6 depicts yet another embodiment of a pinout.

FIG. 6 depicts yet another embodiment with a pinout of a semiconductor device. Pinout 600 of FIG. 6 is largely similar to pinout 500 of FIG. 5, including having stripes of Vss and Vcc interconnects oriented in directions advantageous for having a source of Vss and Vcc at a particular location, such as location 610, as well as extending a stripe of Vss interconnects making up Vss stripe 661 within side 601 into side 604 along center location 605. The principal difference between pinout 500 and pinout 600 is that the extension of Vss stripe 661 is accomplished with Vss interconnects 660 forming a solid stripe.

As was the case with pinout 500, a plurality of filtering components 620 have been placed in center location 605. Filtering components 620 could be capacitors and/or other varieties of components used to counter spikes, troughs and/or other forms of transients in Vss and/or Vcc conductors adjacent to the interconnects of pinout 500. These additional Vss interconnects 660 are provided along one edge of center location 605 within side 604 to enhance the effectiveness of filtering components 620 by providing a shorter conductive path between Vss within a semiconductor device using pinout 600 and at least one of filtering components 620. As was the case with pinout 500, the extension of Vss stripe 661 allows at least a larger trace of conductive material on a PCB where pinout 600 is used to continue along the extended stripe which reduces the likelihood of differential voltages developing between Vss interconnects 660 along the extended stripe.

Referring to both FIGS. 5 and 6, the extension of Vss stripes 561 and 661 with Vss interconnects 560 and 660 become more effective in increasing the effectiveness of filtering components 520 and 620 if there are also Vcc interconnects within sides 504 and 604 such that shortened pathways are offered for both Vcc and Vss. As shown in the examples provided by pinouts 500 and 600 of FIGS. 5 and 6, some embodiments may have Vss interconnects are interspersed throughout sides 504 and 604. Alternatively, as is also shown in pinouts 500 and 600, other embodiments may have a stripe of Vss interconnects parallel to the stripe of Vcc interconnects in sides 504 and 604, possibly also extending stripes of Vss interconnects in another side, such as sides 501 and 601.

Figure 7A:
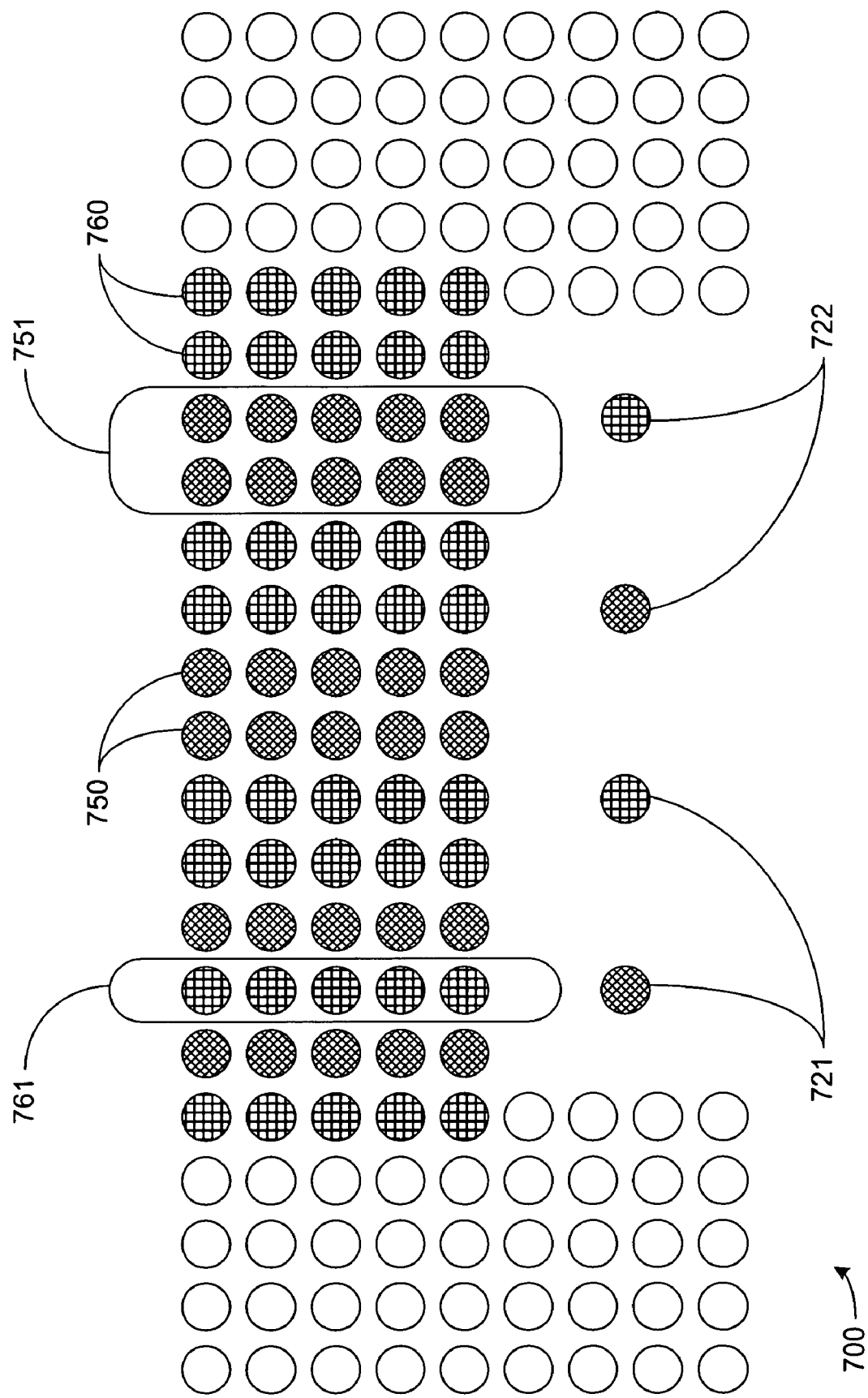
FIGS. 7a and 7b depict an embodiment of a pinout and PCB traces for a semiconductor device using through-hole technology.
Figure 7B:
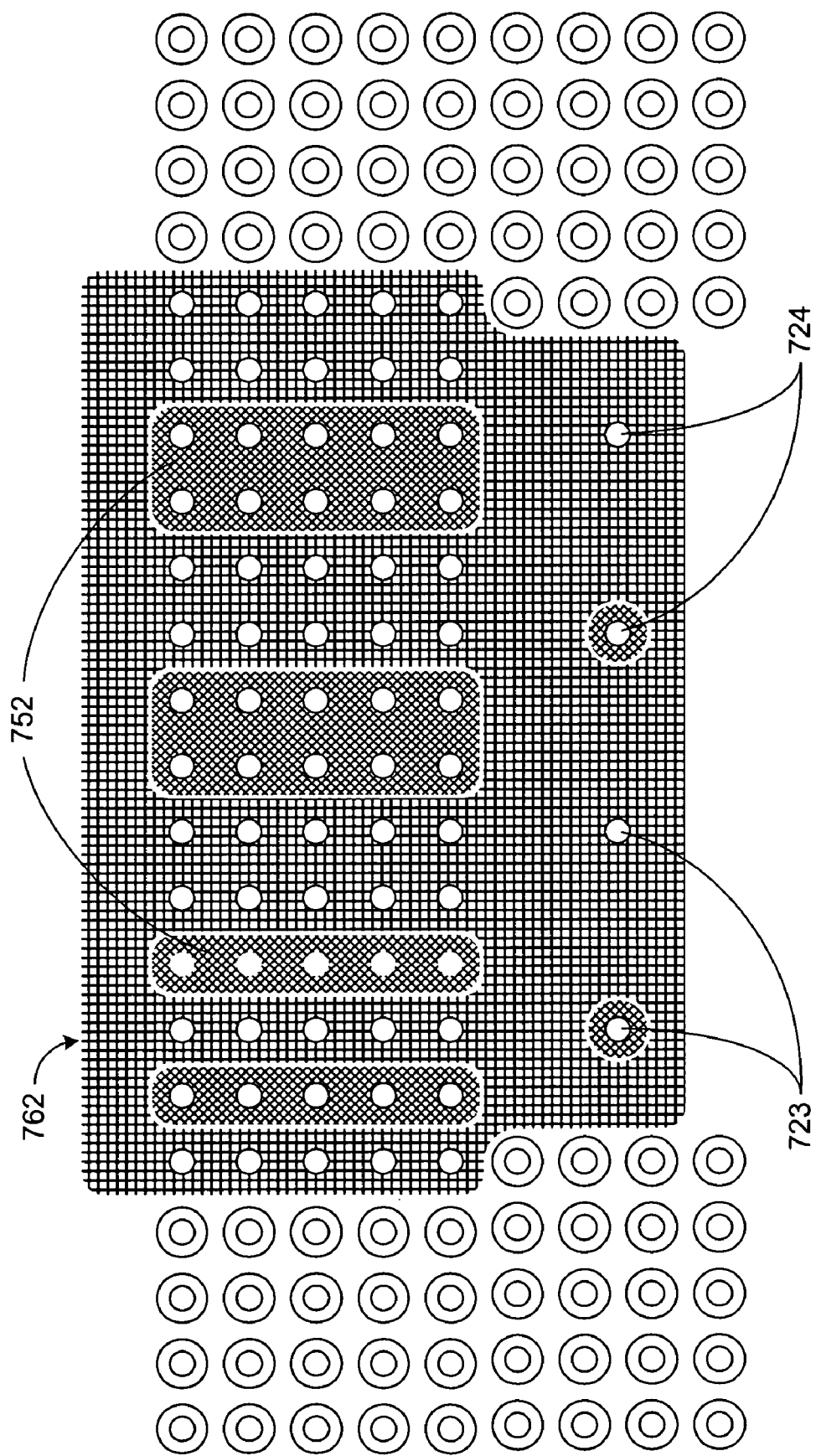

FIGS. 7*a* and 7*b* depict a portion of a pinout for a semiconductor device and the layout of corresponding conductors on a PCB in an embodiment in which through-hole technology is used to mount a semiconductor device to a PCB, as in the case of a semiconductor device using a pin grid array (PGA) package. Referring to FIG. 7*a*, pinout portion 700, in a manner corresponding to previously described embodiments, has Vss interconnects 750 and Vcc interconnects 760 arranged in stripes, such as Vss stripe 751 and Vcc stripe 761. In support of filtering components (not shown), interconnect pairs 721 and 722 are positioned near to pinout portion 700, and provide locations at which filtering components may be installed and thereby connected to Vss and Vcc.

Referring to FIG. 7*b*, the striped arrangement of Vss and Vcc interconnects, 750 and 760, of pinout portion 700 results in a corresponding layout of through-holes in a PCB that permits the conductive material on a layer of that PCB that forms Vss traces 752 to be laid out in a manner that causes relatively fewer breaks in continuity of the conductive material that forms Vcc plane 762 on that same layer. As can be seen, the resulting layout of plane 762 has wider pathways of conductive material formed all the way through pinout portion 700, and although not specifically shown, those skilled in the art of PCB design will readily recognize that a similar layout of a Vss plane is allowed for on another layer of the PCB. This in turn, provides a lower resistance pathway in both the Vcc plane 762 and the corresponding Vss plane for the flow of current between a semiconductor device using pinout portion 700 and both the filtering devices making use of interconnect pairs 721 and 722 (and corresponding pads and through-hole connections at locations 723 and 724), and a power source (not shown) on the side of pinout portion 700 opposite interconnect pairs 721 and 722.

Figure 8A:
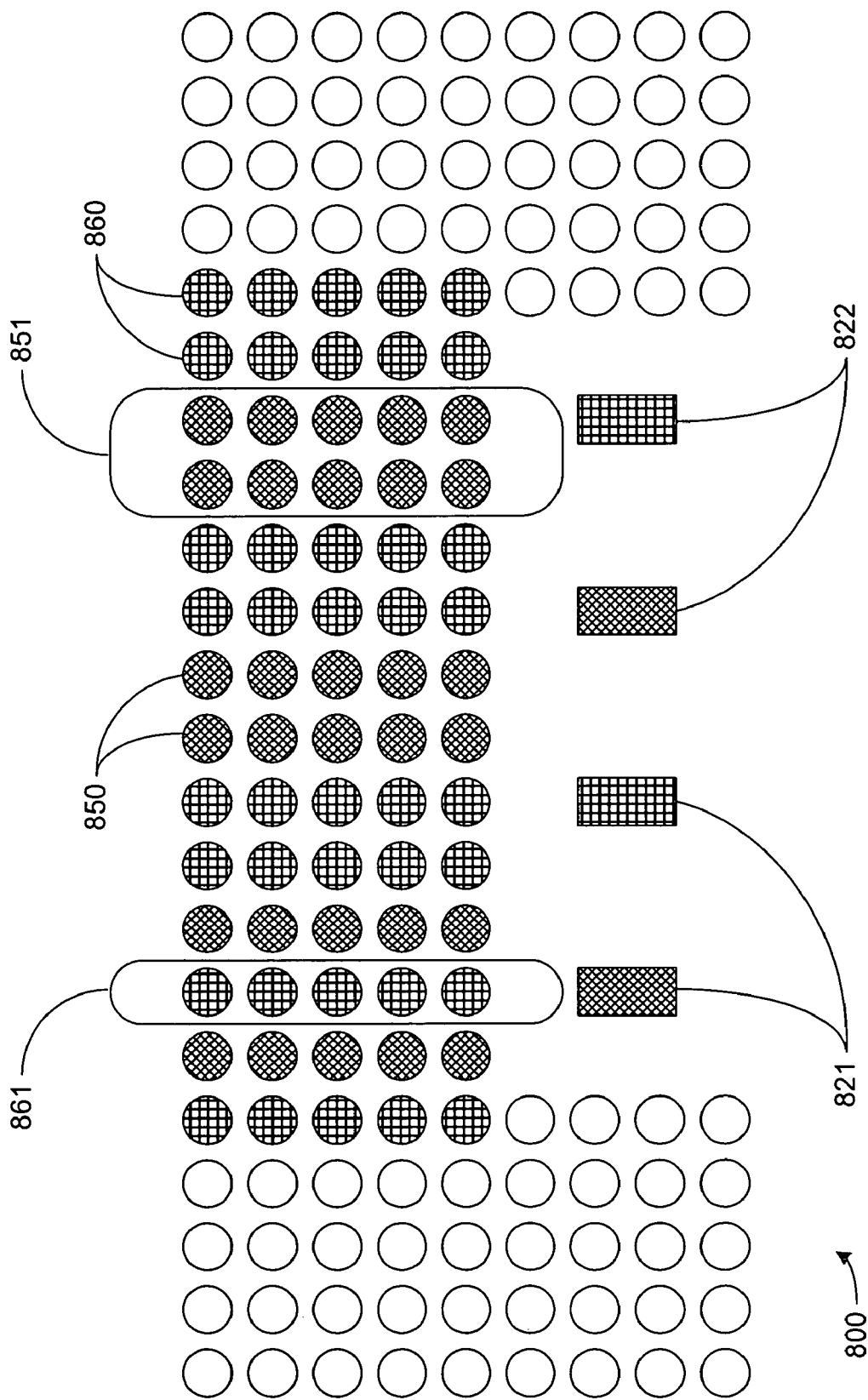
FIGS. 8a and 8b depict an embodiment of a pinout and PCB traces for a semiconductor device using surface mount technology.
Figure 8B:
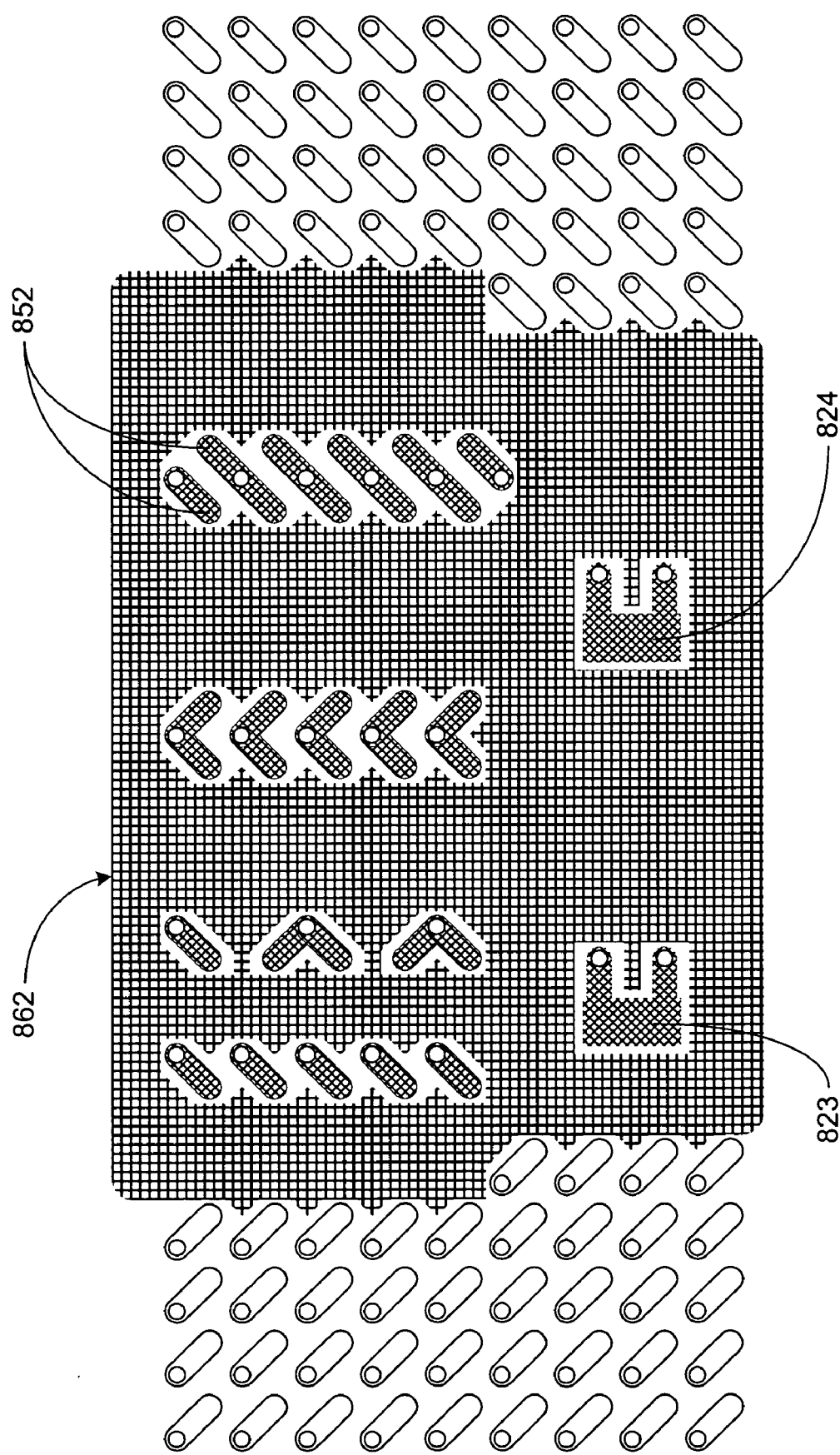

FIGS. 8*a* and 8*b* depict a portion of a pinout for a semiconductor device and the layout of corresponding conductors on a PCB in another embodiment in which surface mount technology is used to mount a semiconductor device to a PCB, as in the case of a semiconductor device using a ball grid array (BGA) package. Referring to FIG. 8*a*, pinout portion 800 is largely identical to pinout portion 700 of FIG. 7*a*, having Vss interconnects 850 and Vcc interconnects 860 arranged in stripes, such as Vss stripe 851 and Vcc stripe 861. In support of filtering components (not shown), interconnect pairs 821 and 822 are positioned near to pinout portion 800, and provide locations at which filtering components may be installed and thereby connected to Vss and Vcc. However, unlike pinout portion 700, pinout portion 800 does indicate the wider pads more common to surface mount capacitors used perform power filtering.

Referring to FIG. 8*b*, the conductive material on a surface of a PCB is laid out in a manner that those skilled in the art of PCB design will recognize as providing locations for soldering pads that are conductively connected to vias penetrating between the surface and other layers of the PCB. The striped arrangement of Vss and Vcc interconnects, 850 and 860, of pinout portion 800 results in a corresponding layout of Vss traces 852 on this surface that allows the vias to arranged in a manner that causes relatively fewer breaks in continuity of the conductive material that forms Vcc plane 862 to which interconnects of a semiconductor device using pinout portion 800 will direct attach. Various possible examples of layout for Vss traces 852 are shown corresponding to each of the stripes of Vss interconnects 850 of pinout 800. As can be seen, the arrangement of Vss interconnects 850 into stripes allows corresponding Vss traces 852 to be laid out so as to require only a single via for at least adjacent pairs of Vss interconnects 850, thereby reducing the number of vias penetrating Vss plane 862.

As can be seen, the resulting layout of plane 862 has wider pathways of conductive material formed all the way through pinout portion 800, and although not specifically shown, those skilled in the art of PCB design will readily recognize that a similar layout of a Vss plane is allowed for on another layer of the PCB. Just as in the case of the embodiment of FIGS. 7*a* and 7*b*, this in turn, provides a lower resistance pathway in both the Vcc plane 862 and the corresponding Vss plane for the flow of current between a semiconductor device using pinout portion 800 and both the filtering devices making use of interconnect pairs 821 and 822 (and corresponding pads and through-hole connections at locations 823 and 824), and a power source (not shown) on the side of pinout portion 800 opposite interconnect pairs 821 and 822.

Figure 9:
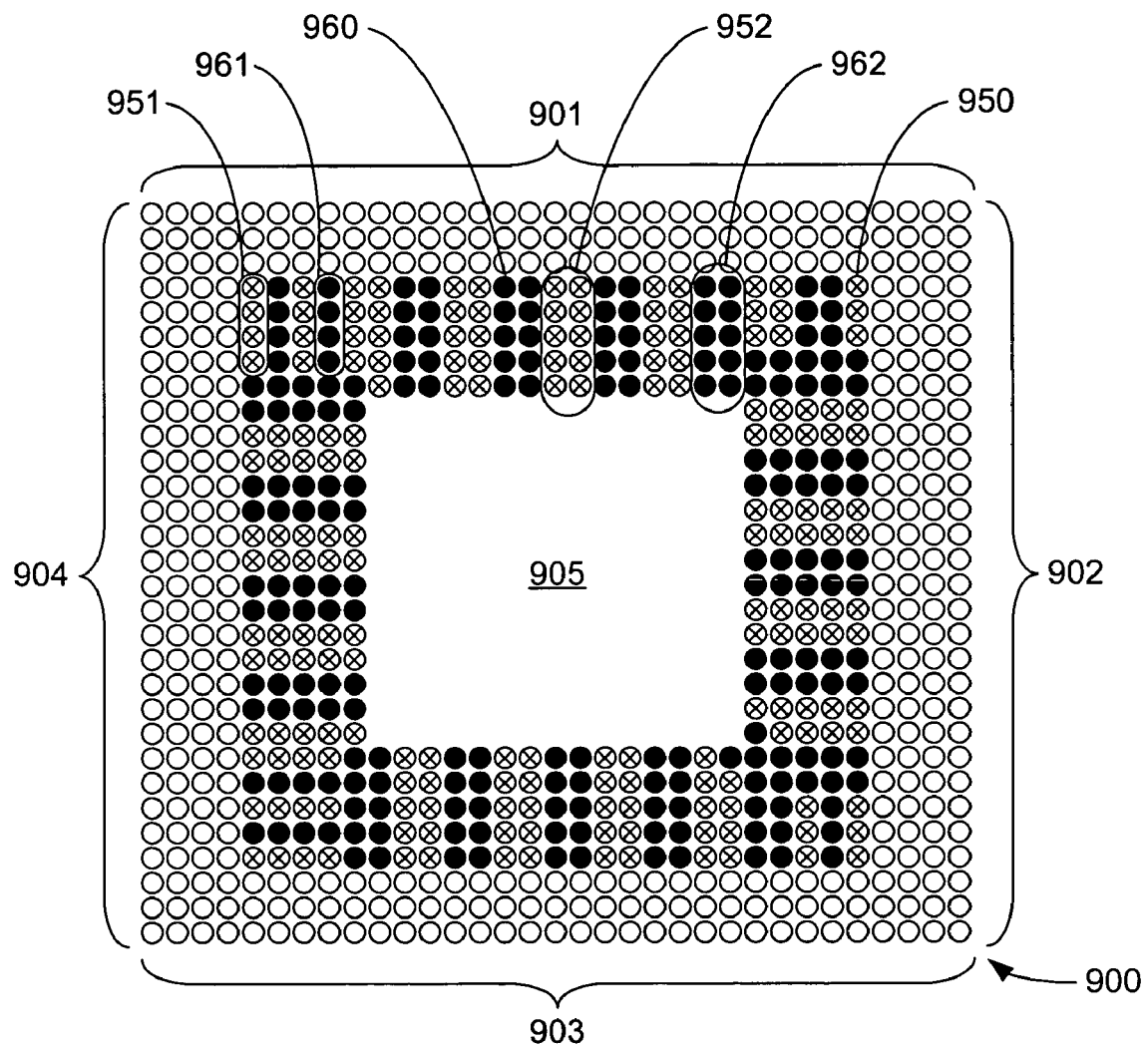
FIG. 9 depicts another embodiment of a pinout.

FIG. 9 depicts another embodiment with a pinout of a semiconductor device. The interconnects of pinout 900 are arranged in a two-dimensional grid pattern having four distinct sides (i.e., sides 901, 902, 903 and 904) and unpopulated center 905. Within all four of sides 901-904 and adjacent to unpopulated center 905, Vss interconnects 950 and Vcc interconnects 960 are arranged in contiguous stripes of interconnects, such as Vss stripes 951 and 952, and Vcc stripes 961 and 962, most of which run in adjacent alternating parallel lines.

Though not actually shown in FIG. 9, like pinouts 300, 400, 500 and 600 of FIGS. 3, 4, 5 and 6, pinout 900 may also have more of Vss interconnects 950 dispersed among signal interconnects and/or other interconnects not connected to either Vss or Vcc. However, as with previously discussed embodiments, the use of differential signaling and/or other factors may allow the number of these additional Vss interconnects to be reduced, or perhaps, eliminated altogether.

The stripes of Vss and Vcc interconnects, 950 and 960, such as Vss stripes 951 and 952, and Vcc stripes 961 and 962, permit traces and/or planes to provide larger pathways to carry current from a power source to the semiconductor device using pinout 900. In one embodiment, the stripes formed by Vss and Vcc interconnects, 950 and 960, as shown, are oriented in directions that would be advantageous for having at least the output stage of a source of Vss and Vcc located on the opposite side of a PCB to which the semiconductor device may be attached, at least partially underneath unpopulated center 905. In alternate embodiments, at least the output stage of a source of Vss and Vcc would be located on the opposite side of the PCB, directly underneath at least a portion of at least one of sides 901-904. Such an output stage of such a source may be made up of one or more inductors positioned on the opposite side of the PCB. In still other embodiments, the output stage of such a source may be a portion of a bus bar and/or an end of a power cable providing Vss and/or Vcc from either a location on the PCB beyond sides 901-904 or a location off the PCB, altogether.

Although FIG. 9 depicts stripes made up of only single or double columns and/or rows of interconnects, it will be understood by those skilled in the art that the teachings herein may be practiced with regard to yet wider stripes (e.g., triple-wide stripes with three columns and/or rows of interconnects, etc.). Wider stripes could enable a larger capacity of current to be carried per stripe, but the choice of width of stripes, in some embodiments, may be based on aspects of the design of the circuitry and/or die of a semiconductor device having Vss interconnects and/or Vcc interconnects arrayed in stripes, or by aspects of the design of the package used for such a semiconductor device. Alternatively, in other embodiments, the choice of width of stripes may be based on aspects such as how inductive the particular type of interconnect used may be and/or the effect of the choice of interconnect on loop inductance between Vcc and Vss pins. Such aspects as are taken into account would have to be balanced with the differences in resistance that would arise for each possible stripe width.

Figure 10A:
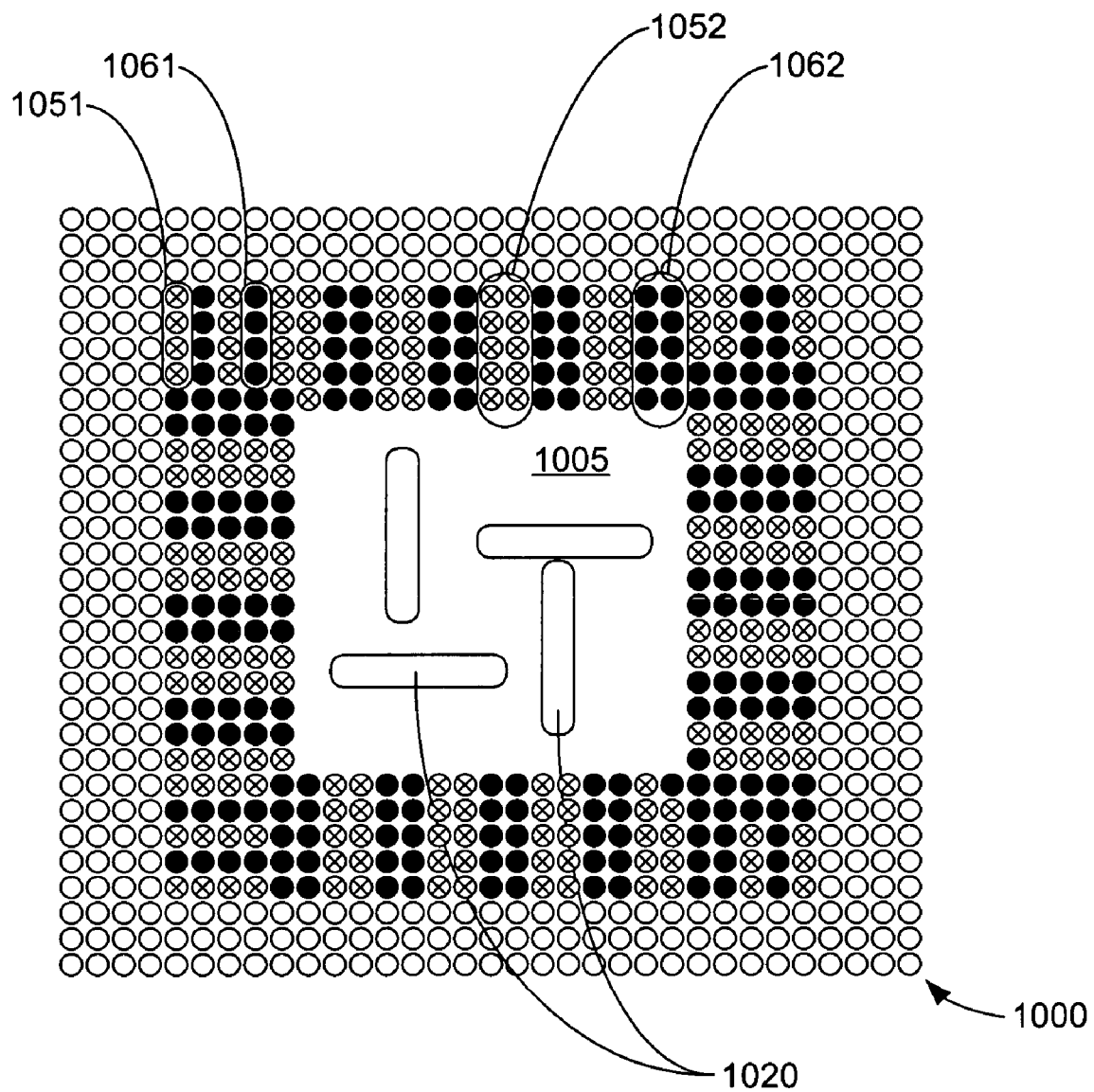
FIGS. 10a-10d depict an embodiment of a pinout and PCB traces for a semiconductor device using through-hole technology.
Figure 10B:
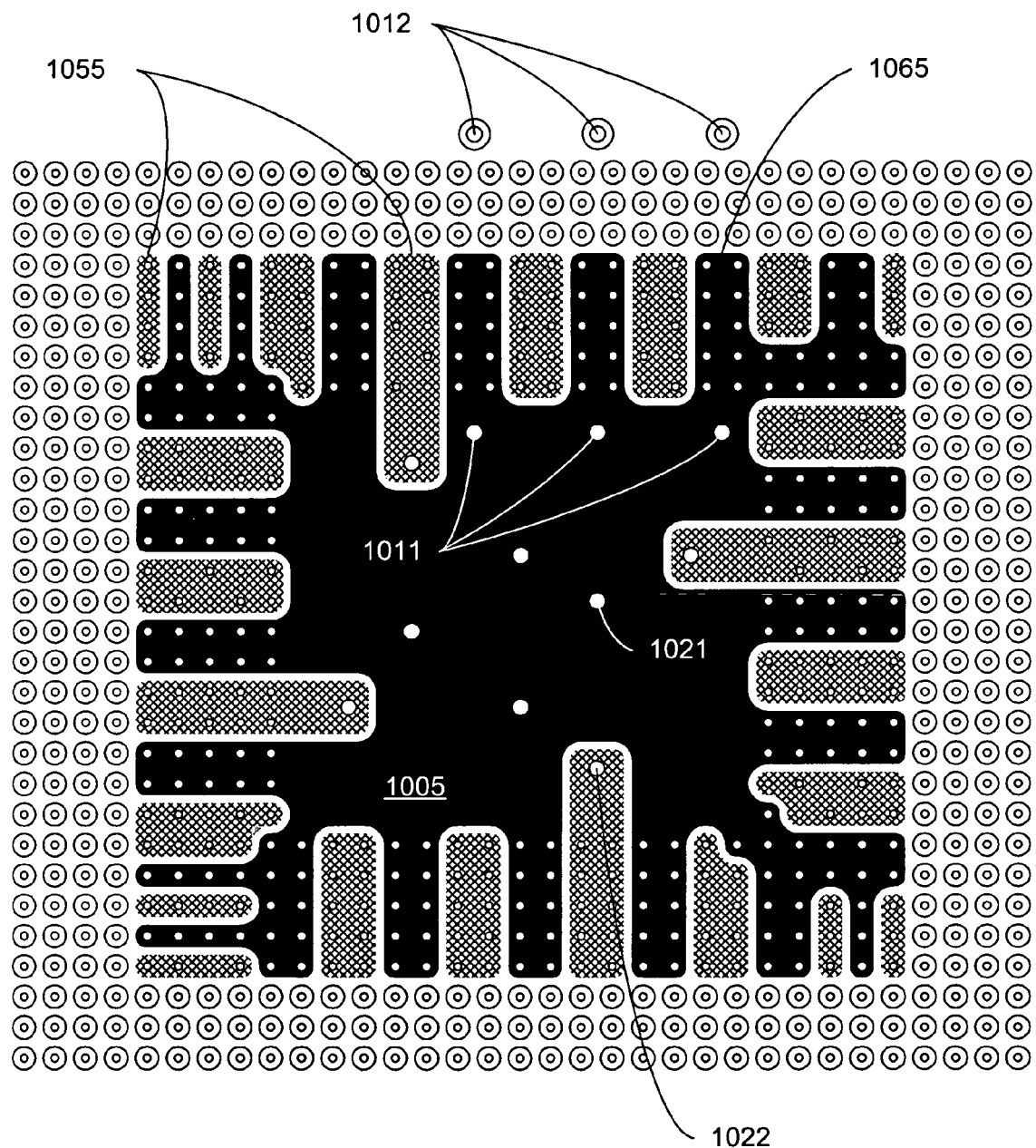
Figure 10C:
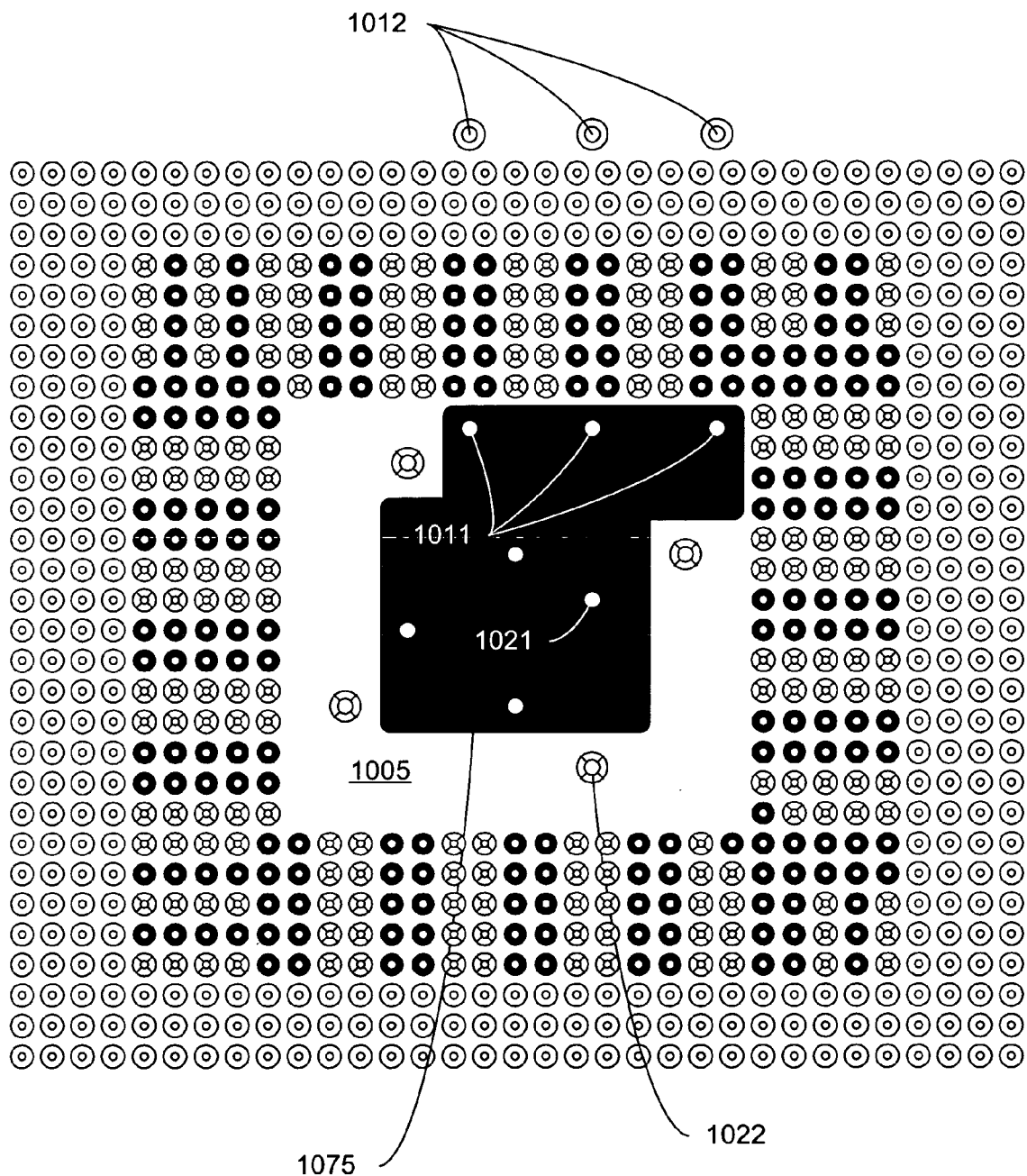
Figure 10D:
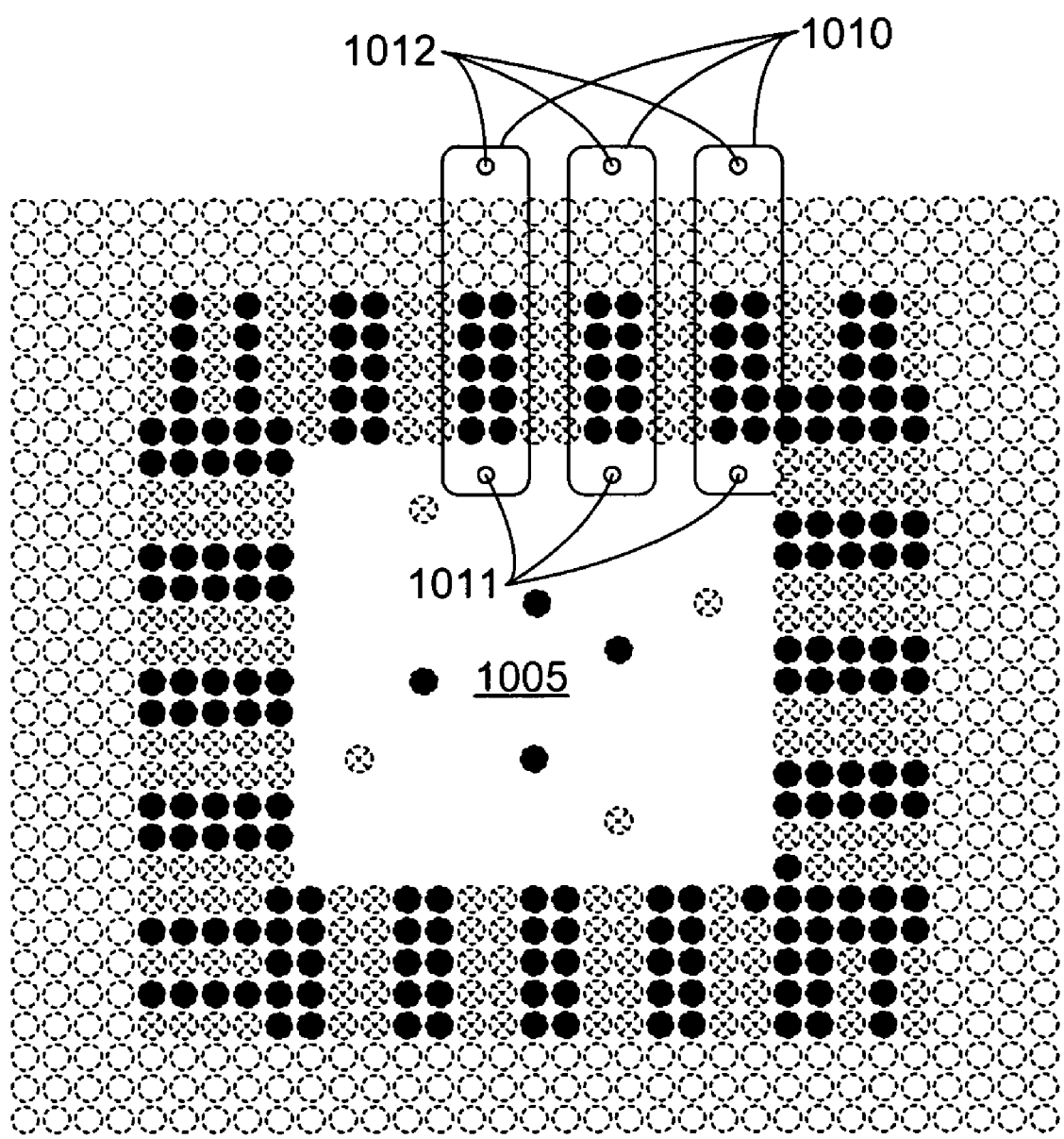
Figure 10E:
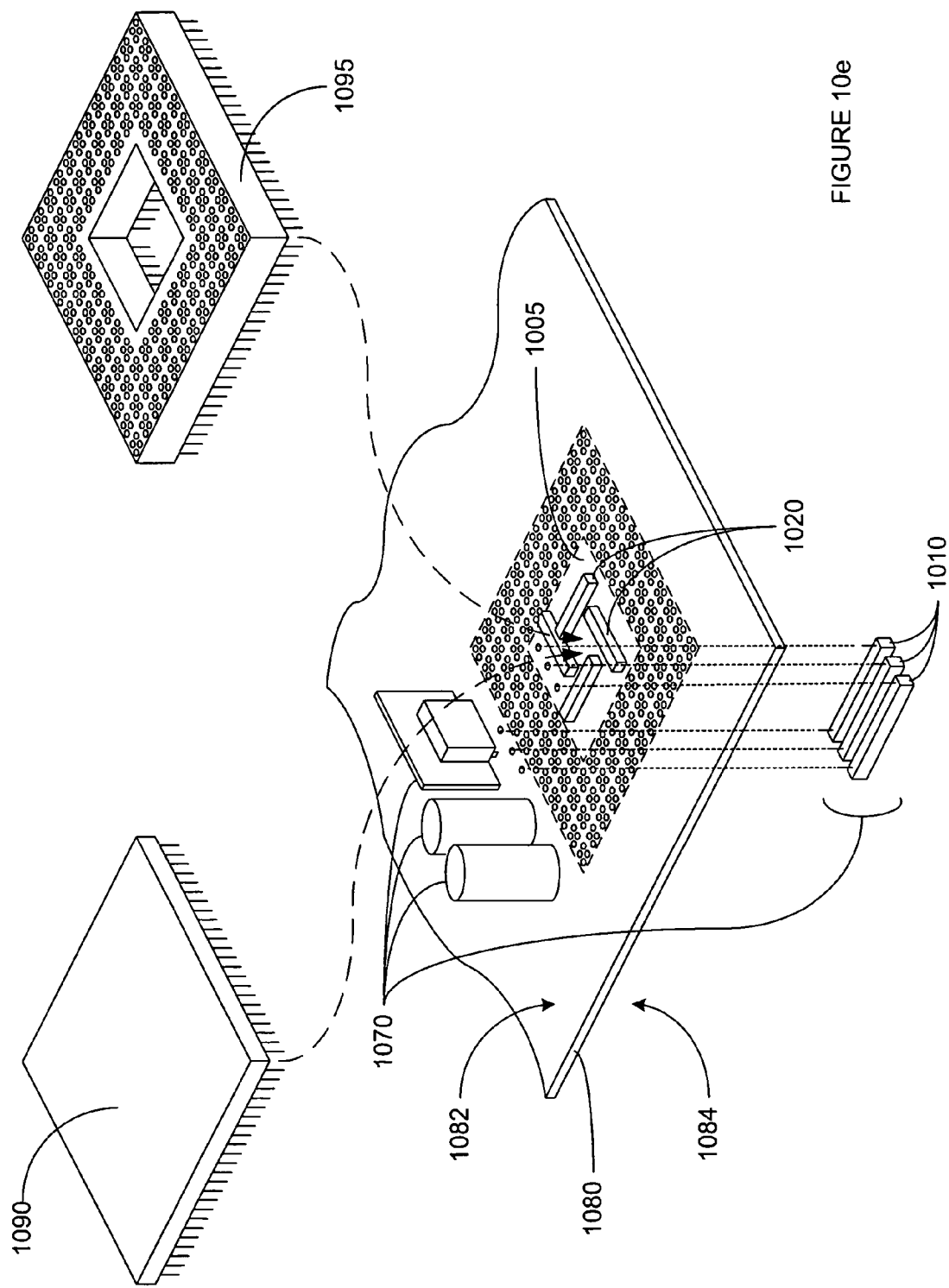
FIG. 10e is a perspective view of the relative placement of components of the embodiment of FIGS. 10a-10d.

FIGS. 10a-10e depict aspects of still another embodiment with a pinout of a semiconductor device, including layers of a PCB with which through-hole technology is used to enable the mounting of the semiconductor device to the PCB, as in the case of a semiconductor device using a pin grid array (PGA) package. FIG. 10a depicts the pinout of the semiconductor device 1090, FIG. 10b depicts the corresponding layout of conductors in the layer on the surface 1082 of the PCB 1080 to which the semiconductor device 1090 is to be attached, FIG. 10c depicts the corresponding layout of conductors in the layer on the surface 1084 of the opposite side of the PCB 1080, and FIG. 10d depicts the corresponding placement of devices 1010 making up at least a part of the output stage of a source of at least Vcc 1070 for the semiconductor device 1090. FIG. 10e is a perspective view of the placement of the components discussed with regard to FIGS. 10a-10d.

Pinout 1000 shown in FIG. 10a is largely similar to pinout 900 of FIG. 9, including having snipes of Vss and Vcc interconnects (e.g., Vss stripes 1051 and 1052, and Vcc stripes 1061 and 1062) oriented in directions advantageous for having at least a portion of the output stage of a source of at least Vcc 1070 within unpopulated center 1005 and/or underlying the location of pinout 1000 on the opposite side 1084 of the PCB 1080 to which the semiconductor device may be attached. The principal difference between pinout 900 and pinout 1000 is the depiction of the positions of filtering components 1020 within unpopulated center 1005. Filtering components 1020 could be capacitors and/or other varieties of components used to counter spikes, troughs and/or other Coins of transients in Vss and/or Vcc conductors adjacent to the interconnects of pinout 1000.

The layout of conductors on the layer on the surface of the PCB 1080 to which the semiconductor device 1090 is to be attached shown in FIG. 10b is made up largely of Vss traces 1055 underlying Vss stripes 1051 and 1052, and Vcc plane 1065 that both underlies Vcc stripes 1061 and 1062 and fills much of unpopulated center 1005. Through one of Vss traces 1055 is formed through-hole 1022, and through Vcc plane 1065 is formed through-hole 1021. Through-holes 1021 and 1022 provide locations through which the pins of one of filtering components 1020 may be inserted, thereby attaching one of filtering components 1020 to the PCB 1080 and connecting its pins to Vcc and Vss. As can be seen in FIG. 10b, through-holes are depicted that similarly underlie the other three of filtering components 1020 depicted in FIG. 10a. Also depicted in FIG. 10b are through-holes 1011 that are also formed through Vcc plane 1065. Though-holes 1011 and through-holes 1012 provide locations through which pins of components 1010 making up at least part of the output stage of a source for at least Vcc 1070 may be inserted, thereby attaching pins of such components to both Vss and other electrical traces not underlying the location of the semiconductor device 1090 on the PCB 1080.

The layout of conductors on the layer on the surface 1084 of the PCB opposite that to which the semiconductor device 1090 is to be attached and opposite to that in which Vcc plane 1065 exists is shown in FIG. 10c. In one embodiment, the layout of conductors on this layer is patly made up of Vcc plane 1075 within unpopulated center 1005 and largely underlying Vcc plane 1065. In alternate embodiments, other planes or traces of conductive material may exist in addition to or in place of Vcc plane 1075. Through-holes, such as through-holes 1011 and 1021, serve to electrically couple Vcc planes 1065 and 1075, together.

The position of source devices 1010 that make up at least part of the output stage of the source of at least Vcc 1070 is shown in FIG. 10d. Source devices 1010 are attached to the PCB 1080 on the surface 1084 opposite that to which the semiconductor device 1090 is attached, providing a way by which Vss is brought towards unpopulated center 1005 from the rest of the source of at least Vcc 1070 by straddling the locations of interconnects of pinout 1000 (shown in broken lines, overlying the locations of source devices 1010). This relative location of source devices 1010 aids in minimizing the distance and resistance between the output stage of the source of at least Vcc 1070 and the interconnects of pinout 1000 by which Vss is supplied to the semiconductor device. This relative positioning aids in assuring that a broad conductive path with plenty of conductive capacity between the output stage of the source of at least Vcc 1070 and the semiconductor device 1090 that is not compromised by being routed through the many penetrations in the PCB required for through-holes for the pins of the semiconductor device or the socket used to attach the semiconductor device to the PCB. In some embodiments, source devices 1010 are inductors straddling between unpopulated center 1005 at the location of through-holes 1011 and the other components making up the source of at least Vcc 1070, which may, in some embodiments incorporate one or more voltage regulators.

Figure 11A:
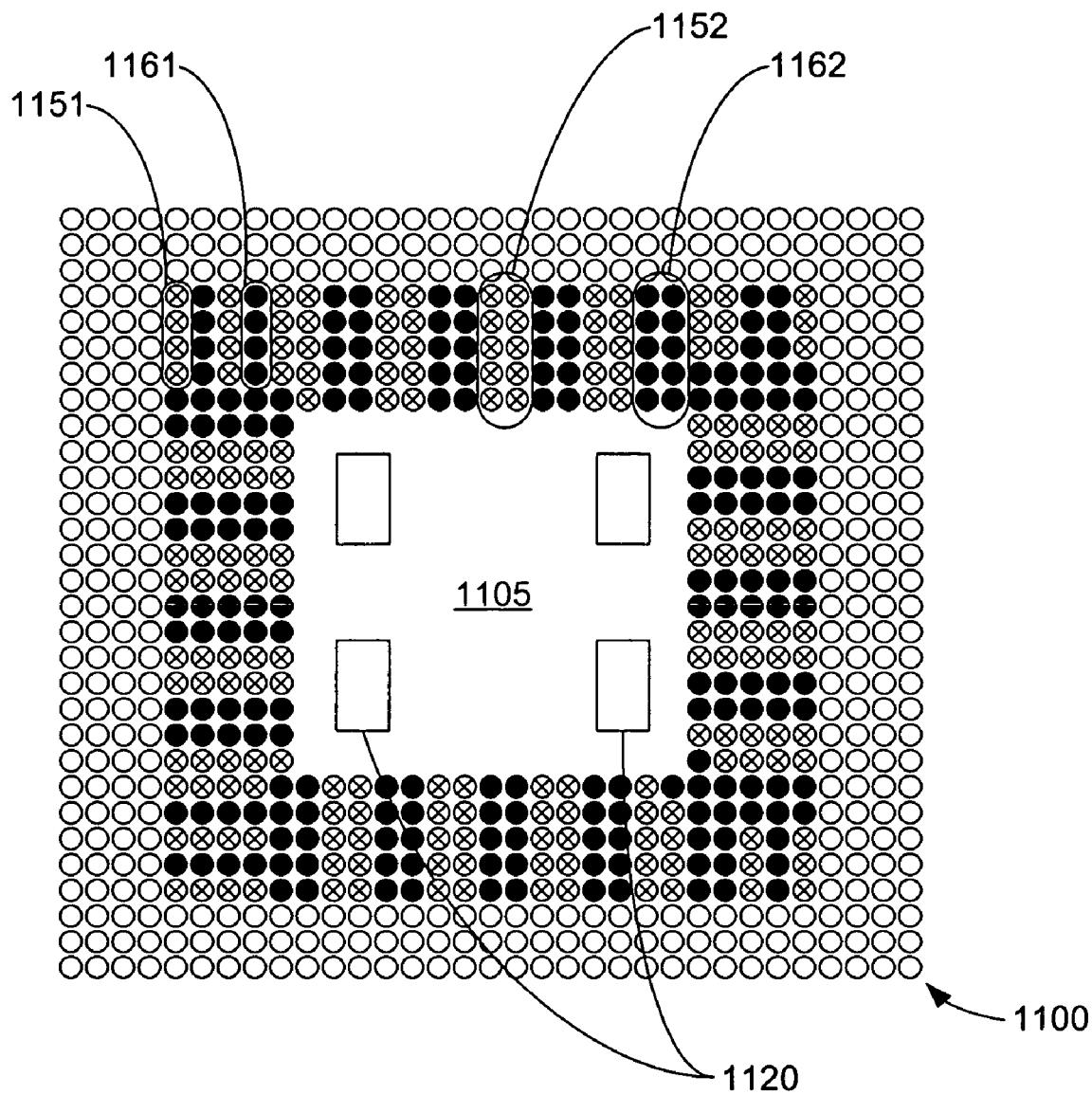
FIGS. 11a-11d depict an embodiment of a pinout and PCB traces for a semiconductor device using surface mount technology.
Figure 11B:
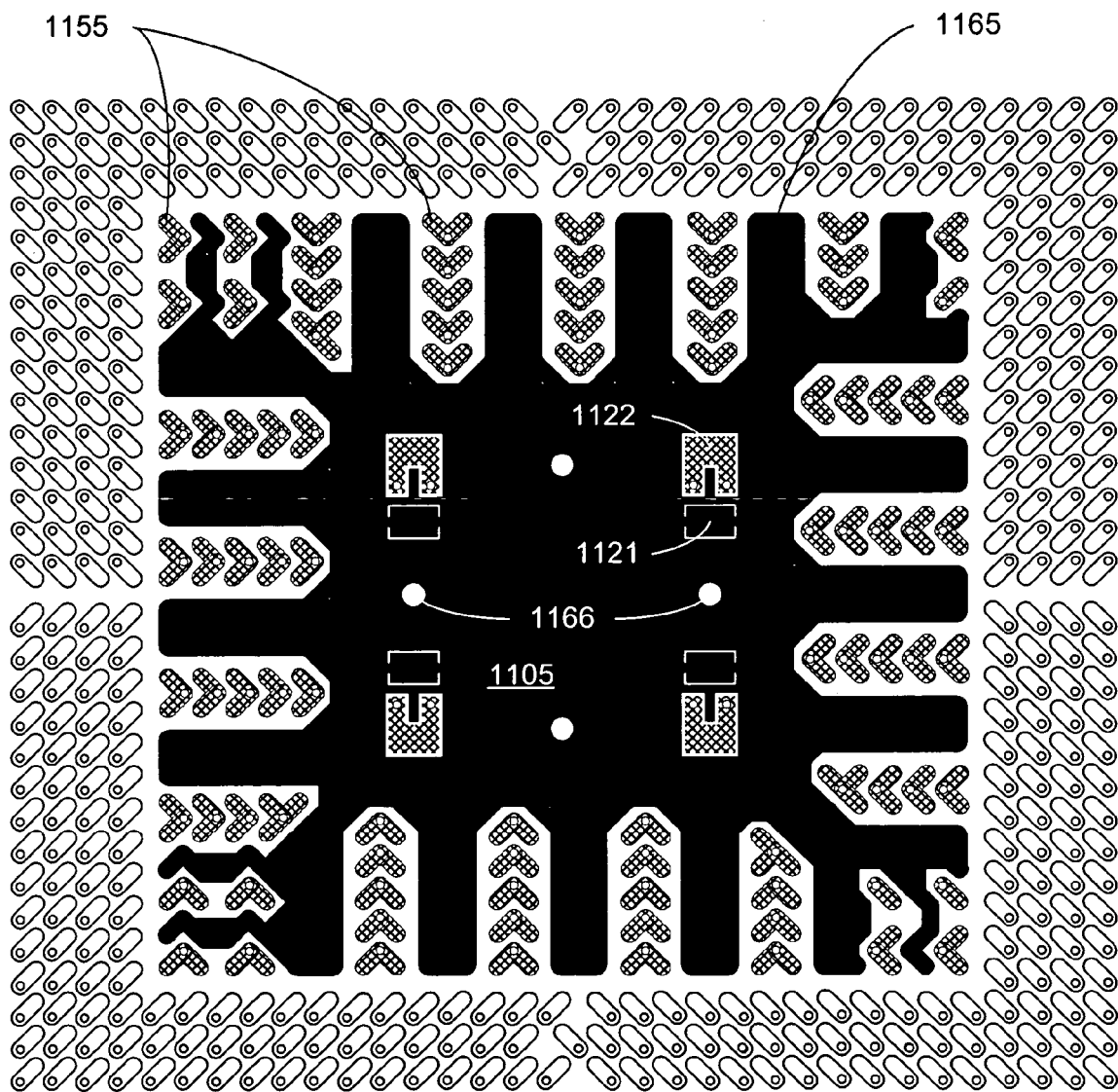
Figure 11C:
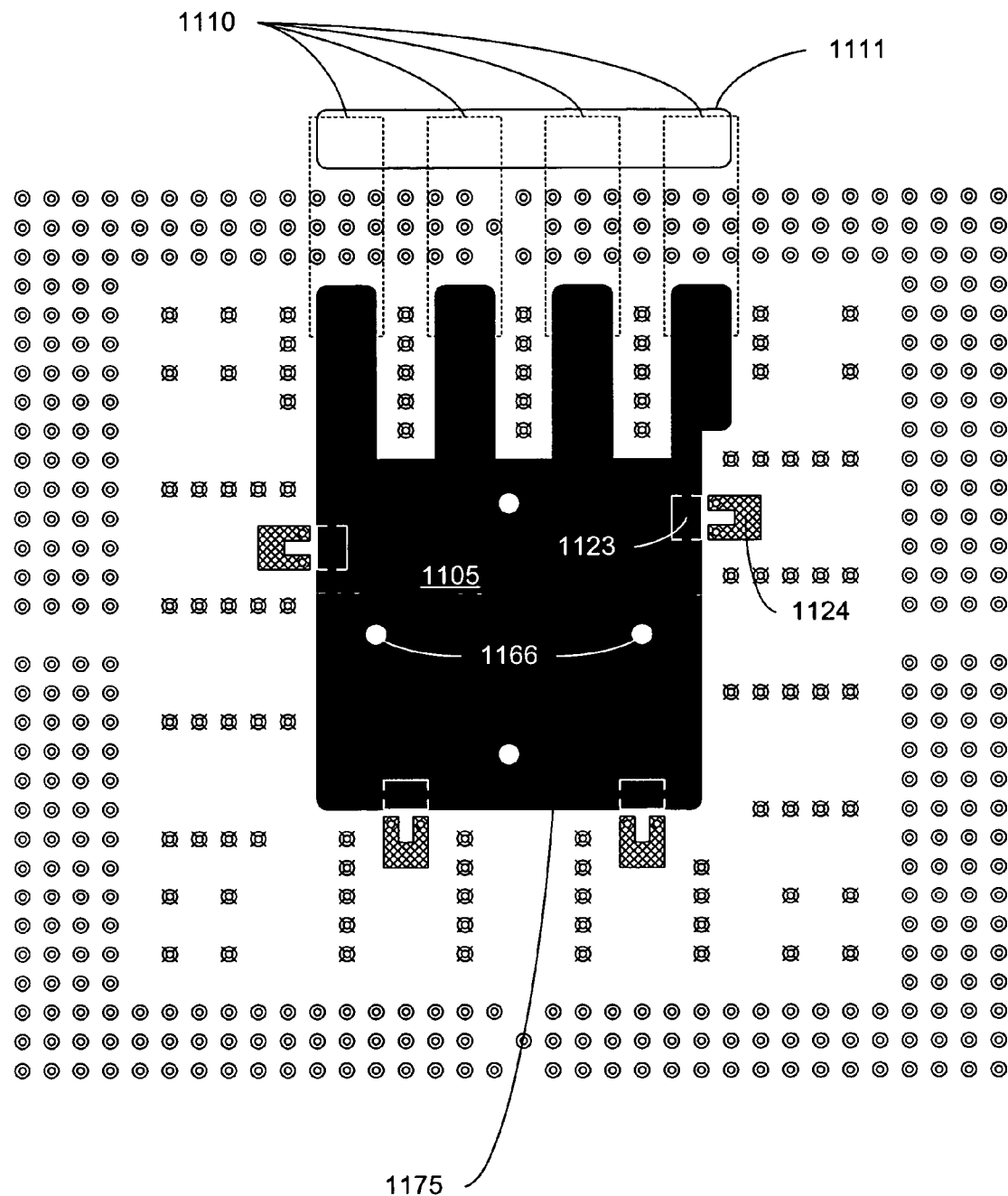
Figure 11D:
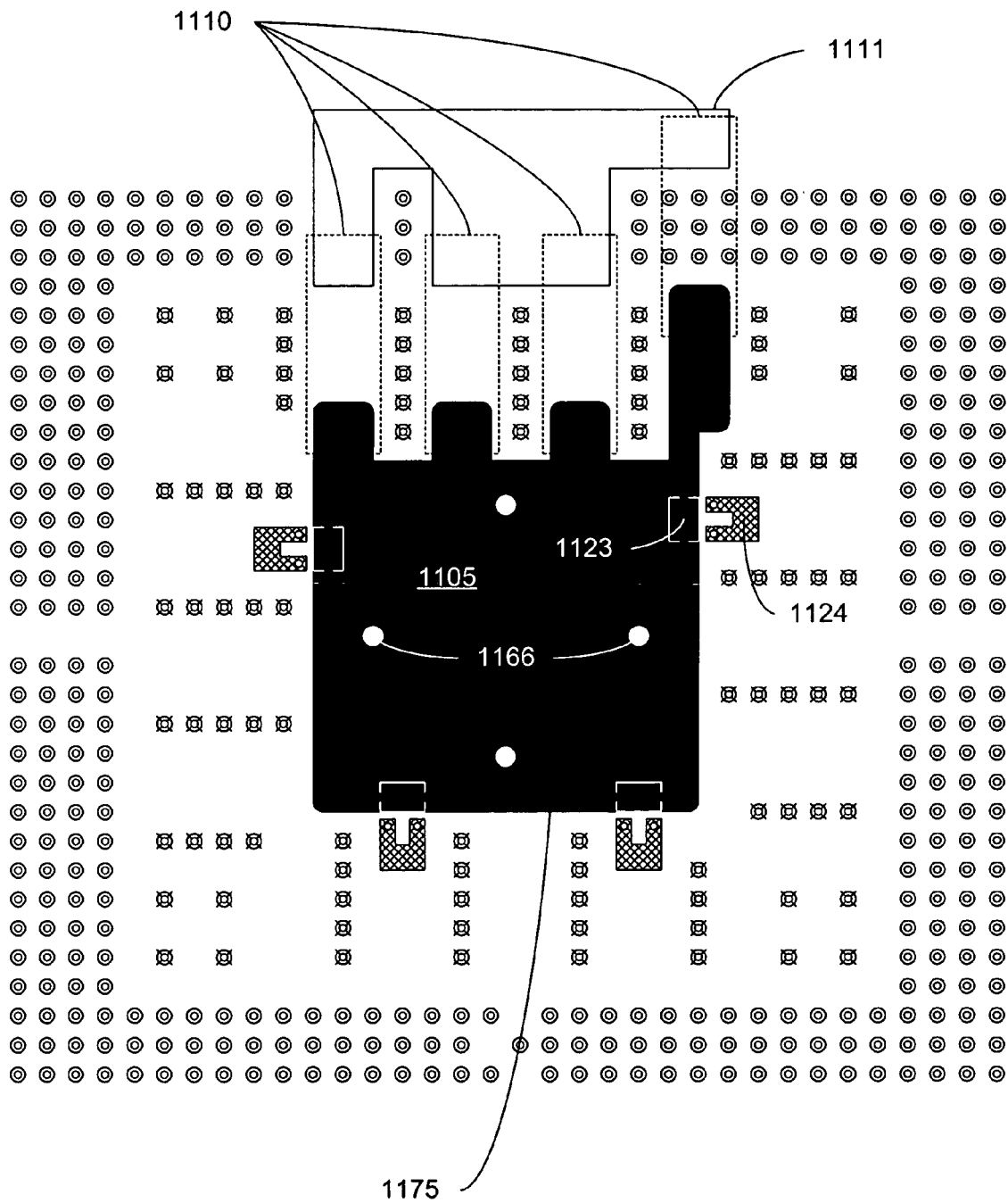

FIGS. 11a-11d depict aspects of yet another embodiment with a pinout of a semiconductor device, including layers of a PCB with which surface mount technology is used to enable the mounting of the semiconductor device to the PCB, as in the case of a semiconductor device using a ball grid array (BGA) package. FIG. 11a depicts the pinout of the semiconductor device, and FIG. 11b depicts the corresponding layout of conductors in the layer on the surface of the PCB to which the semiconductor device is to be attached. FIGS. 11c and 11d depict variations of corresponding layouts of conductors in the layer on the surface of the opposite side of the PCB, along with the corresponding placement of devices making up at least a part of the output stage of a source of at least Vcc for the semiconductor device.

Pinout 1100 shown in FIG. 11a is largely similar to pinout 900 of FIG. 9, including having stripes of Vss and Vcc interconnects (e.g., Vss stripes 1051 and 1052, and Vcc stripes 1061 and 1062) oriented in directions advantageous for having at least a portion of the output stage of a source of at least Vcc within unpopulated center 1105 and/or underlying the location of pinout 1100 on the opposite side of the PCB to which the semiconductor device may be attached. The principal difference between pinout 900 and pinout 1100 is the depiction of the positions of filtering components 1120 within unpopulated center 1105. Filtering components 1120 could be capacitors and/or other varieties of components used to counter spikes, troughs and/or other forms of transients in Vss and/or Vcc conductors adjacent to the interconnects of pinout 1100.

The layout of conductors on the layer on the surface of the PCB to which the semiconductor device is to be attached shown in FIG. 11b is made up largely of Vss traces 1155 underlying Vss stripes 1151 and 1152, and Vcc plane 1165 that both underlies Vcc stripes 1161 and 1162 and fills much of unpopulated center 1105. Form amidst Vcc plane 1165 is Vss pad 1122 and adjacent Vcc pad 1121. Vss pad 1122 and Vcc pad 1121 provide locations to which the pins of one of filtering components 1120 may be attached via standard surface mounting techniques, thereby attaching one of filtering components 1120 to the PCB and connecting its pins to Vcc and Vss. As can be seen in FIG. 11b, Vss and Vcc pads are depicted that similarly underlie the other three of filtering components 1120 depicted in FIG. 11a. Also depicted in FIG. 11b are vias 1166 that are also formed through Vcc plane 1165. Vias 1166 may be used to provide a conductive connection between Vcc plane 1165 and conductors on other layers of the PCB.

The layout of conductors on the layer on the surface of the PCB opposite that to which the semiconductor device is to be attached and opposite to that in which Vcc plane 1165 exists is shown in FIGS. 11c and 11d. In one embodiment, the layout of conductors on this layer is partly made up of Vcc plane 1175 located within unpopulated center 1105 and largely underlying Vcc plane 1165. In alternate embodiments, other planes or traces of conductive material may exist in addition to or in place of Vcc plane 1175. Vias 1166 may be used to electrically couple Vcc planes 1165 and 1175, together.

A variation of the position of source devices 1110 that make up at least part of the output stage of the source of at least Vcc is also shown in FIG. 11c. Source devices 1110 (shown in broken lines underlying the location of vias for interconnects of the semiconductor device) are attached to the PCB on the surface opposite that to which the semiconductor device is attached, thereby providing a way by which Vss is brought towards unpopulated center 1105 by straddling the locations of such vias. The pins of source devices 1110 are shown coupled to Vss plane 1175 and to conductive trace 1111 beyond the perimeter formed by the vias. This relative location of source devices 1110 aids in minimizing the distance and resistance between the output stage of the source of at least Vcc and the interconnects by which Vcc is supplied to the semiconductor device. This relative positioning aids in assuring that a broad conductive path with plenty of conductive capacity between the output stage of the source of at least Vcc and the semiconductor device that is not compromised by being routed through the many penetrations in the PCB required for the vias.

FIG. 11d is largely identical to FIG. 11c, but depicts an alternate variation of the placement of source devices 1110. As depicted, at least some of source devices 1110 underly the location of interconnects of pinout 1100 such that at least some of source devices 1110 do not actually straddle vias used to provide connections to those interconnects of pinout 1100. This may be enabled through the use of either blind and/or buried vias, and/or the use of traces emanating from the location of the pads for the interconnects depicted in FIG. 11b on the same layer of conductive material as those pads. In other words, an area underlying pinout 1100 is "kept clear" for at least one of source devices 1110 to be positioned.

Referring to the various aforedescribed embodiments, the number of stripes of Vss and/or Vcc interconnects, the width(s) of those stripes, and/or the exact layout of traces and/or planes connecting to the interconnects making up those stripes may be arrayed to control or achieve desired inductance characteristics. In some embodiments, the number and/or width of stripes may be chosen to make use of inductance characteristics of the particular type of interconnect used to make up a given pinout. Inductance characteristics that are more desirable than those often encountered with the interspersing of Vcc and/or Vss interconnects may thereby be achieved. Alternatively, in other embodiments, the opportunity for wider traces of conductive material and/or planes of conductive material penetrated with fewer holes may be used to achieve desired inductance characteristics among the layers of conductive material of a PCB.

The teachings herein have been exemplified in conjunction with the preferred embodiment. Numerous alternatives, modifications, variations and uses will be apparent to those skilled in the art in light of the foregoing description. It will be understood by those skilled in the art that the invention as hereinafter claimed may be practiced in support of a wide variety of semiconductor devices using a wide variety of packages including, but not limited to, pin grid array and ball grid array. Also, although the example embodiments provided depict pinouts in which an open center location exists, it will be readily understood that the invention as hereinafter claimed may also be practiced in the support of semiconductor devices with pinouts that do not leave an open center location.

What is claimed is:

1. A semiconductor device comprising:
   a package; and
   a plurality of interconnects attached in a grid-like pinout to a first face of the package of the semiconductor device, wherein the grid-like pinout has a center in which there are no interconnects, wherein a first subset of the plurality of interconnects is connectable to a first power supply voltage, wherein a second subset of the plurality of interconnects is connectable to a second power supply voltage, wherein the interconnects of the first and second subsets are arrayed into a first group of alternating adjacent parallel stripes of interconnects, each parallel stripe of the first and second subsets comprised of a plurality of rows and a plurality of columns of interconnects, the parallel stripes of the first group perpendicular to a first outer edge of the grid-like pinout, and wherein each of the alternating parallel stripes terminates at a first edge of the center.

2. The semiconductor device of claim 1, wherein a third subset of the plurality of interconnects is connectable to the first power supply voltage and are among a fourth subset of the plurality of interconnects that is not connectable to a power supply voltage.

3. The semiconductor device of claim 1, wherein the plurality of interconnects are solderable to a surface of a PCB to mount the package to the surface of the PCB.

4. The semiconductor device of claim 1, wherein the plurality of interconnects are insertable through holes formed in a PCB to mount the package to the PCB.

5. The semiconductor device of claim 1, wherein the plurality of interconnects are insertable into a socket mounted to a PCB to mount the package to the PCB.

6. The semiconductor device of claim 1, wherein a plurality of filtering components are positioned within the center.

7. The semiconductor device of claim 1, wherein a third subset of the plurality of interconnects is connected to the first power supply voltage, wherein a fourth subset of the plurality of interconnects is connected to the second power supply voltage, wherein the interconnects of the third and fourth subsets are arrayed into a second group of alternating adjacent parallel stripes of interconnects, each parallel stripe of the third and fourth subsets comprised of a plurality of rows of interconnects and a plurality of columns of interconnects, the parallel stripes perpendicular to a second outer edge of the grid-like pinout and parallel to the first outer edge of grid-like pinout, and wherein each of the alternating parallel stripes terminates at a second edge of the center.

8. The semiconductor device of claim 7, wherein a fifth subset of the plurality of interconnects is connected to the first power supply voltage, wherein the interconnects of the fifth subset are arrayed into a stripe of interconnects, the stripe perpendicular to the first outer edge of the grid-like pinout and parallel to the second outer edge of grid-like pinout, and wherein the stripe forms a third edge of the center.

* * * * *

UNITED STATES PATENT AND TRADEMARK OFFICE
CERTIFICATE OF CORRECTION

| | | |
|---|---|---|
| PATENT NO. | : 7,319,269 B2 | Page 1 of 1 |
| APPLICATION NO. | : 11/089914 | |
| DATED | : January 15, 2008 | |
| INVENTOR(S) | : Osburn | |

It is certified that error appears in the above-identified patent and that said Letters Patent is hereby corrected as shown below:

In column 10, at line 57, delete "and second subsets" and insert --group--.

In column 12, at line 2, delete "third and fourth subsets" and insert --second group--.

Signed and Sealed this

Twenty-sixth Day of August, 2008

JON W. DUDAS
*Director of the United States Patent and Trademark Office*